(12) United States Patent
Shimada et al.

(10) Patent No.: US 8,242,557 B2
(45) Date of Patent: Aug. 14, 2012

(54) TRENCH GATE TYPE TRANSISTOR

(75) Inventors: Satoru Shimada, Gifu (JP); Yoshikazu Yamaoka, Gifu (JP); Kazunori Fujita, Gifu (JP); Tomonori Tabe, Gifu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 198 days.

(21) Appl. No.: 12/447,820

(22) PCT Filed: Sep. 26, 2008

(86) PCT No.: PCT/JP2008/068116
§ 371 (c)(1),
(2), (4) Date: Apr. 29, 2009

(87) PCT Pub. No.: WO2009/041743
PCT Pub. Date: Apr. 2, 2009

(65) Prior Publication Data
US 2010/0059816 A1  Mar. 11, 2010

(30) Foreign Application Priority Data
Sep. 28, 2007 (JP) .................................. 2007-255091

(51) Int. Cl.
*H01L 29/76* (2006.01)
(52) U.S. Cl. ................................ 257/330; 257/E29.201
(58) Field of Classification Search ................... 257/330
See application file for complete search history.

(56) References Cited

U.S. PATENT DOCUMENTS

| 5,321,289 | A | 6/1994 | Baba et al. |
| 6,291,298 | B1 | 9/2001 | Williams et al. |
| 6,365,932 | B1 | 4/2002 | Kouno et al. |
| 2003/0089946 | A1 * | 5/2003 | Hshieh et al. ................. 257/338 |
| 2004/0188803 | A1 | 9/2004 | Matsuda |

(Continued)

FOREIGN PATENT DOCUMENTS

CN  101138093 A  3/2008

(Continued)

OTHER PUBLICATIONS

International Search Report, mailed Dec. 22, 2008, directed to related International Patent Application No. PCT/JP2008/068115; 3 pages.

(Continued)

*Primary Examiner* — Howard Weiss
*Assistant Examiner* — Tifney Skyles
(74) *Attorney, Agent, or Firm* — Morrison & Foerster LLP

(57) ABSTRACT

The invention provides a trench gate type transistor in which the gate capacitance is reduced, the crystal defect is prevented and the gate breakdown voltage is enhanced. Trenches are formed in an N− type semiconductor layer. A uniformly thick silicon oxide film is formed on the bottom of each of the trenches and near the bottom, being round at corner portions. A silicon oxide film is formed on the upper portion of the sidewall of each of the trenches, which is thinner than the silicon oxide film and round at corner portions. Gate electrodes are formed from inside the trenches onto the outside thereof. The thick silicon oxide film reduces the gate capacitance, and the thin silicon oxide film on the upper portion provides good transistor characteristics. Furthermore, with the round corner portions, the crystal defect does not easily occur, and the gate electric field is dispersed to enhance the gate breakdown voltage.

3 Claims, 27 Drawing Sheets

U.S. PATENT DOCUMENTS

2007/0290260 A1* 12/2007 Adan ............................. 257/330
2009/0078995 A1 3/2009 Nakagawa et al.
2010/0102382 A1 4/2010 Shimada et al.

FOREIGN PATENT DOCUMENTS

| JP | 9-283535 A | 10/1997 |
|---|---|---|
| JP | 2001-015733 A | 1/2001 |
| JP | 2001-358338 | 12/2001 |
| JP | 2003-509836 | 3/2003 |
| JP | 2003-188379 A | 7/2003 |
| JP | 2004-055659 A | 2/2004 |
| JP | 2005-510087 | 4/2005 |
| JP | 2005-322949 A | 11/2005 |
| JP | 2006-344760 A | 12/2006 |
| WO | WO-03/044865 A1 | 5/2003 |
| WO | WO-2006/132284 A1 | 12/2006 |

OTHER PUBLICATIONS

International Search Report, mailed Sep. 5, 2006, directed to a counterpart International Patent Application No. PCT/JP2008/068116; 6 pages.

Shimada, S. et al., U.S. Office Action mailed Jun. 10, 2011, directed to U.S. Appl. No. 12/447,817; 10 pages.

* cited by examiner

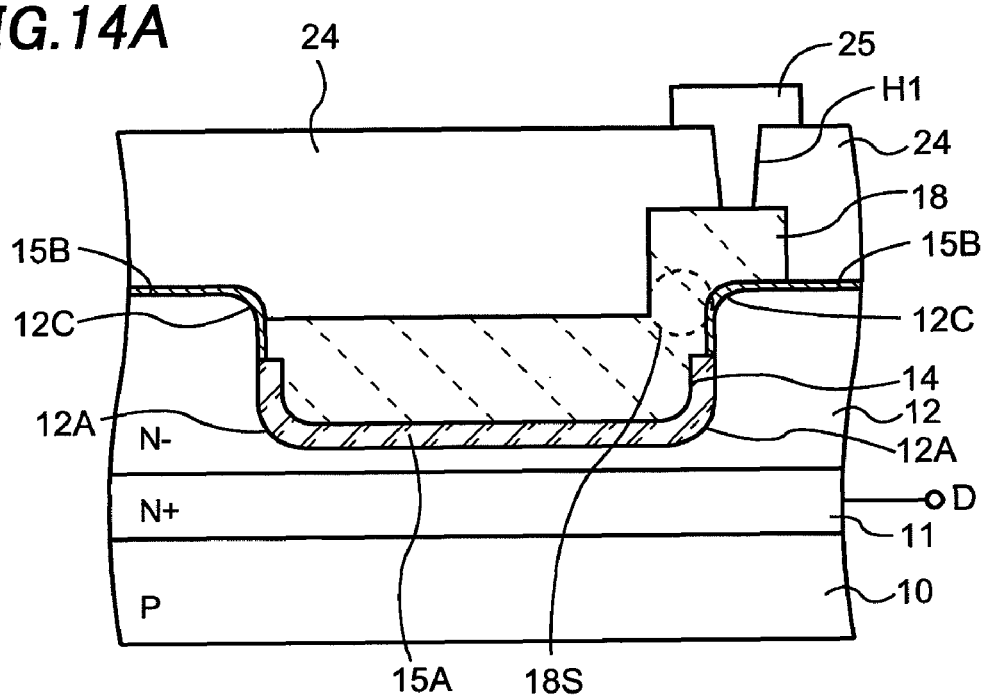
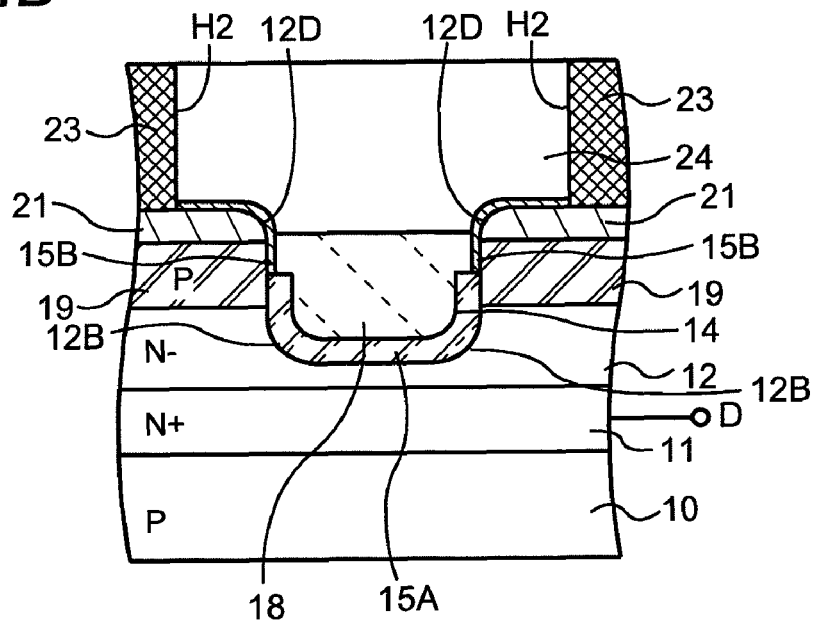

TRENCH GATE TYPE TRANSISTOR

REFERENCE TO RELATED APPLICATIONS

This application is a national stage application under 35 USC 371 of International Application No. PCT/JP2008/068116, filed Sep. 26, 2008, which claims priority from Japanese Patent Application No. 2007-255091, filed Sep. 28, 2007, the contents of which are incorporated herein by reference.

BACKGROUND OF THE INVENTION

1. Field of the Invention

The invention relates to a trench gate type transistor and a method of manufacturing the same.

2. Description of the Related Art

A DMOS transistor is a double-diffused MOS field effect transistor and used as a power semiconductor device for a power supply circuit, a driver circuit or the like. A trench gate type transistor is known as a type of DMOS transistor.

This trench gate type transistor is configured by forming a gate insulation film 115 in a trench 114 formed in a semiconductor layer 112 and forming a gate electrode 116 covering the gate insulation film 115 in the trench 114 as shown in FIG. 27. A body layer and a source layer (not shown) are further formed in the front surface of the semiconductor layer 112 on the sidewall of the trench 114 by double-diffusion in the vertical direction.

A trench gate type transistor is described in Japanese Patent Application Publication Nos. 2005-322949, 2003-188379 and 2005-510087.

However, the conventional trench gate type transistor has problems that the gate capacitance (of the gate electrode 116, the gate insulation film 115 and the semiconductor layer 112) is large, the semiconductor layer 112 near the trench 114 easily has crystal defects, and the gate breakdown voltage is low due to gate electric field concentration.

SUMMARY OF THE INVENTION

The main features of the invention are as follows.

The invention provides a trench gate type transistor including a semiconductor layer, a gate insulation film formed in a trench formed in the semiconductor layer and extending onto the semiconductor layer on an outside of the trench, a gate electrode formed on the gate insulation film, and a body layer formed in the semiconductor layer near its front surface and contacting the gate insulation film on a sidewall of the trench, the gate insulation film having a first thickness on an upper portion of the sidewall of the trench, and a second thickness on a lower portion of the sidewall of the trench and on a bottom surface of the trench, the second thickness being larger than the first thickness, and the trench being round from the bottom surface to the sidewall.

With this structure, since the gate insulation film is thick on the lower portion of the sidewall of the trench and on the bottom surface of the trench, the gate capacitance is reduced accordingly. Furthermore, since the gate insulation film is thin on the upper portion of the sidewall of the trench, good transistor characteristics (low threshold, low on-resistance) are obtained. Furthermore, since the trench is round from the bottom surface to the sidewall, the semiconductor layer near the trench does not easily have crystal defects, and the gate electric field is dispersed to enhance the gate breakdown voltage.

The invention also provides a method of manufacturing a trench gate type transistor, including: forming a trench in a semiconductor layer; forming an oxide film on a front surface of the semiconductor layer including in the trench by thermally oxidizing the semiconductor layer formed with the trench; forming a photoresist reinforcement film on the oxide film; forming a photoresist layer on the photoresist reinforcement film including in the trench; leaving the photoresist layer and the photoresist reinforcement film only in the trench by etching back the photoresist layer and the photoresist reinforcement film to expose the oxide film; removing the oxide film on the front surface of the semiconductor layer and on an upper portion of a sidewall of the trench by etching the exposed oxide film using the photoresist layer and the photoresist reinforcement film as a mask; removing the photoresist layer and the photoresist reinforcement film; forming a gate oxide film having a first thickness on the upper portion of the sidewall of the trench and a second thickness on a lower portion of the sidewall of the trench and on a bottom surface of the trench by thermal oxidation, the second thickness being larger than the first thickness; forming a gate electrode on the gate oxide film; and forming a body layer on the sidewall of the trench so as to contact the gate oxide film.

The invention also provides a method of manufacturing a trench gate type transistor, including: forming a trench in a semiconductor layer; forming an oxide film on a front surface of the semiconductor layer including in the trench by thermally oxidizing the semiconductor layer formed with the trench; forming a photoresist reinforcement film on the oxide film; forming a BARC on the photoresist reinforcement film including in the trench; forming a photoresist layer on the BARC including in the trench; exposing the BARC on an active region by forming an opening in the photoresist layer on the active region by exposure and development; leaving the BARC and the photoresist reinforcement film in the trench by etching back the BARC and the photoresist reinforcement film using the photoresist layer as a mask to expose the oxide film; removing the oxide film on the front surface of the semiconductor layer and on an upper portion of a sidewall of the trench by etching the exposed oxide film using the photoresist layer and the photoresist reinforcement film as a mask; removing the photoresist layer, the BARC and the photoresist reinforcement film; forming a gate oxide film having a first thickness on the upper portion of the sidewall of the trench and a second thickness on a lower portion of the sidewall of the trench and on a bottom surface of the trench by thermal oxidation, the second thickness being larger than the first thickness; forming a gate electrode on the gate oxide film; and forming a body layer on the sidewall of the trench so as to contact the gate oxide film.

The trench gate type transistor and the method of manufacturing the same of the invention reduce the gate capacitance. Furthermore, the crystal defects are prevented and the gate breakdown voltage is enhanced.

BRIEF DESCRIPTION OF THE DRAWINGS

FIGS. 2 to 15 are cross-sectional views for explaining the trench gate type transistor and the method of manufacturing the same of the first embodiment of the invention.

DETAILED DESCRIPTION OF THE INVENTION

First Embodiment

Figure 1:
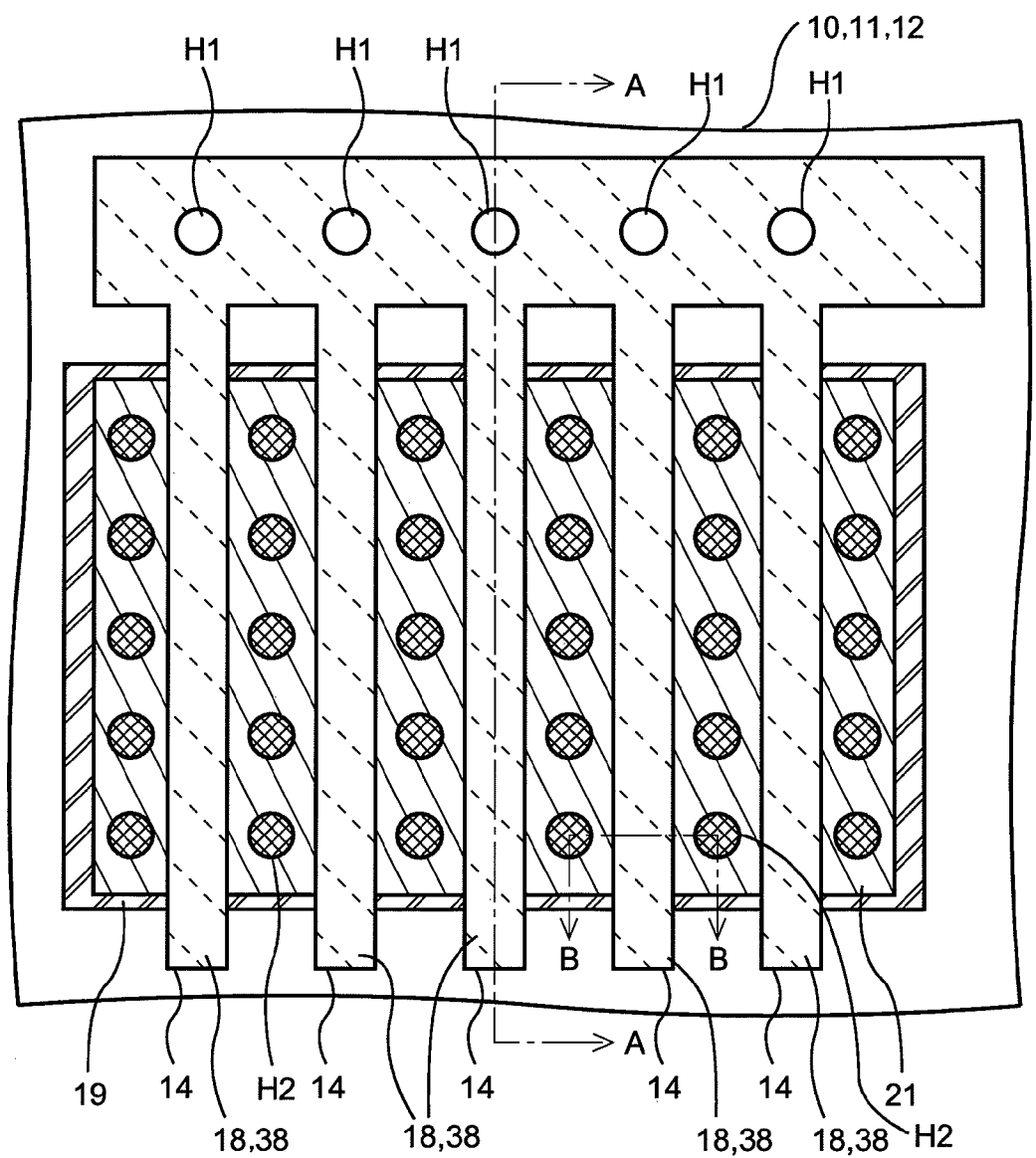
FIGS. 1 and 16 are plan views for explaining a trench gate type transistor and a method of manufacturing the same of first and second embodiments of the invention.
Figure 2A:
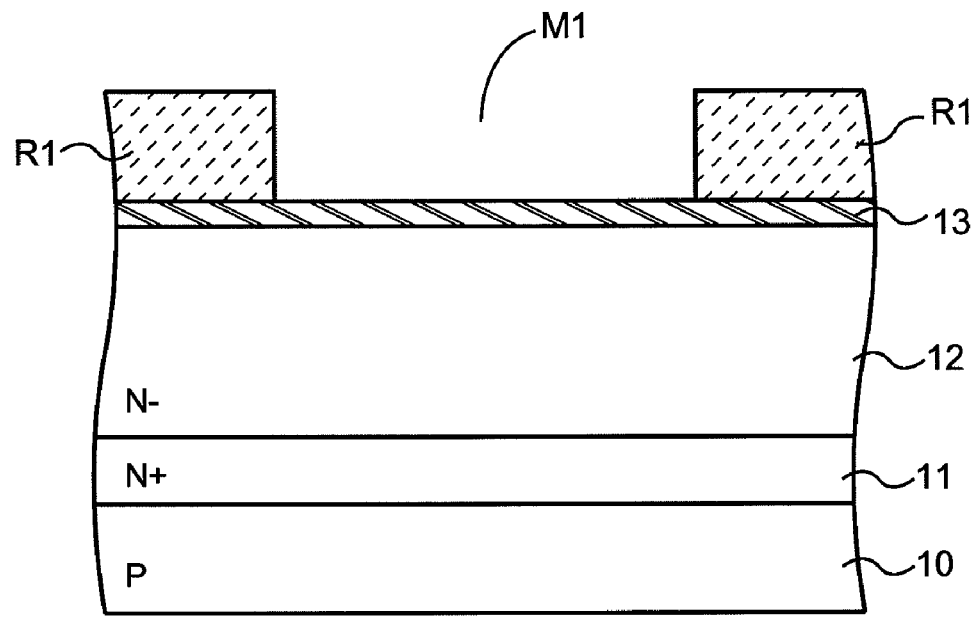
Figure 2B:
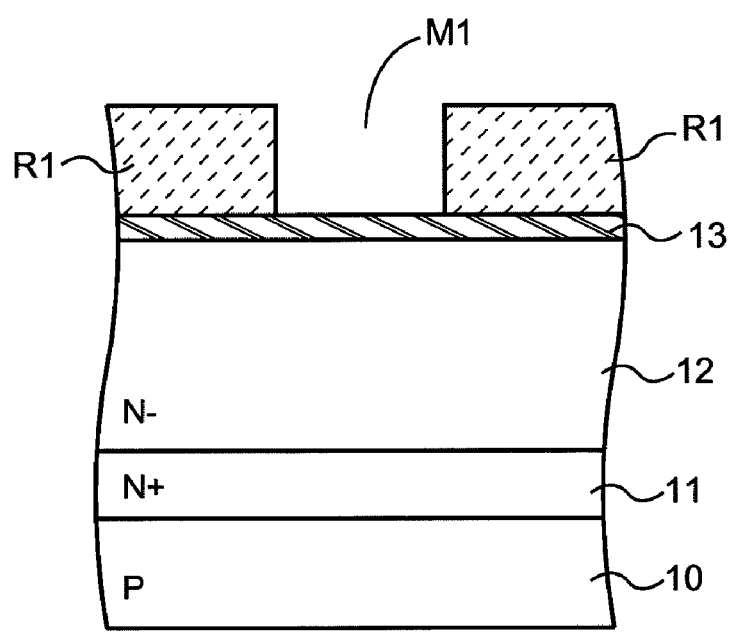

A first embodiment of the invention will be described referring to figures. FIG. 1 is a plan view for explaining a trench gate type transistor and a method of manufacturing the same of the embodiment of the invention. FIGS. 2(A) to 14(A) are cross-sectional views of FIG. 1 along line A-A, and FIGS. 2(B) to 14(B) are cross-sectional views of FIG. 1 along line B-B. In the following description, the trench gate type transistor is referred to as a transistor simply. The conductive type of this transistor is not limited, but the following description is given for a case of an N channel type transistor.

First, the schematic plan structure of the transistor of the embodiment will be described referring to FIG. 1. Here, only main elements will be described. In this transistor, an N+ type semiconductor layer 11 and an N− type semiconductor layer 12 are formed on a P type semiconductor substrate 10, and a plurality of trenches 14 each having short sides and long sides is formed in the N− type semiconductor layer 12 on the front surface side through a region where a body layer 19 is formed. A gate electrode 18 is formed in each of the trenches 14 with a gate insulation film (not shown) being interposed therebetween. The gate electrodes 18 are connected to each other in one ends of the trenches 14, extending onto the outside of the trenches 14. The gate electrodes 18 extending onto the outside of the trenches 14 are connected to wires (not shown) through contact holes H1 provided in an interlayer insulation film (not shown).

It is noted that other high breakdown voltage MOS transistor (not shown) may be formed on the same N− type semiconductor layer 12 near this transistor.

Hereafter, the trench gate type transistor and the method of manufacturing the same of the embodiment will be described referring to figures.

As shown in FIG. 2, the N+ type semiconductor layer 11 and the N− type semiconductor layer 12 are formed by doping N type impurities in the front surface of the P type semiconductor substrate 10 and then epitaxially growing the semiconductor layers. Hereafter, the description is given supposing that the semiconductor substrate 10 is of a silicon single crystal substrate and the N+ type semiconductor layer 11 and the N− type semiconductor layer 12 are of a silicon single crystal semiconductor layer, but the invention is not limited to this. Then, a silicon oxide film 13 is formed on the N− type semiconductor layer 12 by a CVD method or a thermal oxidation treatment. Furthermore, a photoresist layer R1 having an opening M1 is formed on the silicon oxide film 13. The opening M1 has a plurality of rectangles with short sides and long sides.

Figure 3A:
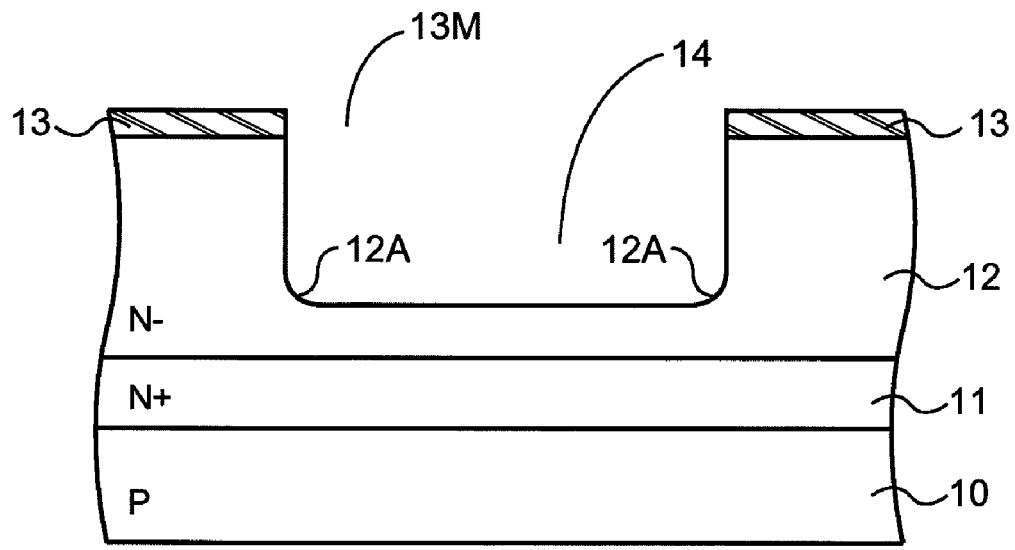
Figure 3B:
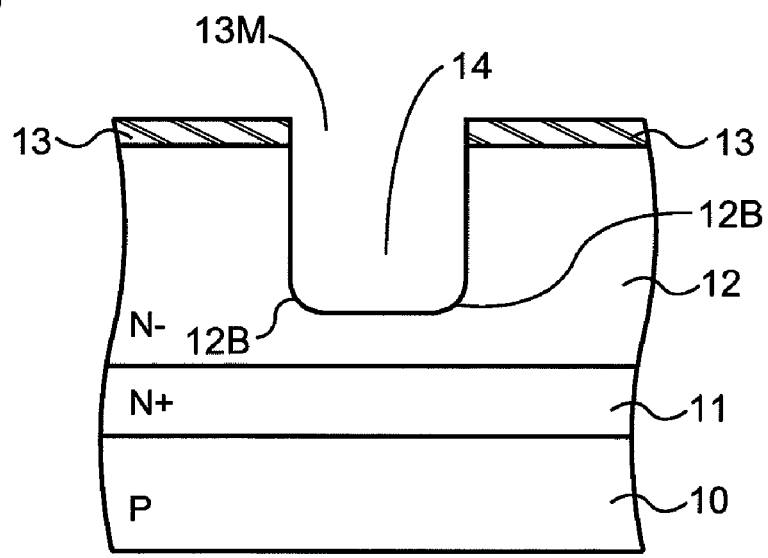

Then, as shown in FIG. 3, the silicon oxide film 13 is etched using the photoresist layer R1 as a mask to form an opening 13M in the silicon oxide film 13. After the photoresist layer R1 is removed, the N− type semiconductor layer 12 is etched using the silicon oxide film 13 as a hard mask to form the plurality of trenches 14 with short sides and long sides corresponding to the opening 13M. This etching is dry-etching using etching gas containing $SF_6$, for example. Therefore, the corner portions 12A and 12B of the N− type semiconductor layer 12 at the bottoms of the trenches 14 are formed to be round (i.e. curved). Preferably, the depth of the trench 14 is about 1.5 μm, the long side is about 50 μm, and the short side is about 0.5 μm. The silicon oxide film 13 is then removed.

Figure 4A:
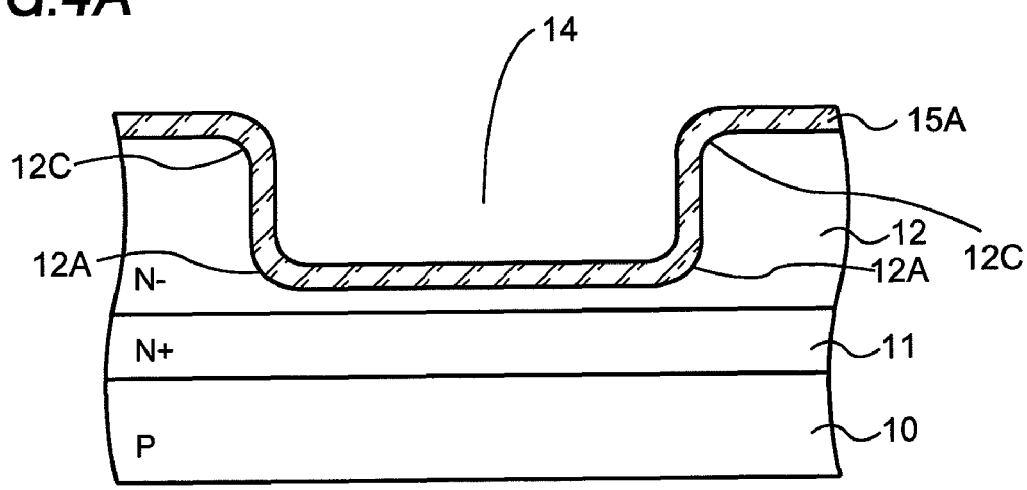
Figure 4B:
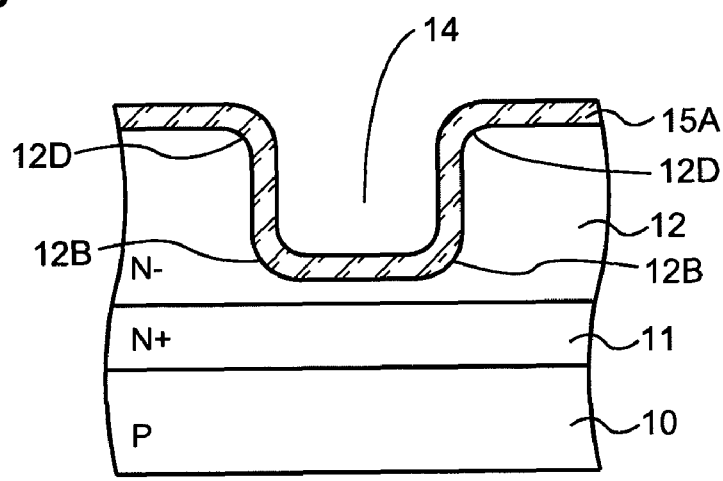

Then, as shown in FIG. 4, a thermal oxidation treatment is performed to the N− type semiconductor layer 12 including in the trenches 14 to form a silicon oxide film 15A. Preferably, the thickness of the silicon oxide film 15A at this time is about 100 nm. The silicon oxide film 15A is formed to be round from the bottoms to the sidewalls of the trenches 14, reflecting the round corner portions 12A and 12B of the N− type semiconductor layer 12 at the bottoms of the trenches 14. The silicon oxide film 15A is also formed to be round (i.e. curved) at a portion extending from inside the trenches 14 onto the N− type semiconductor layer 12 on the outside of the trenches 14, i.e., at the upper end portions of the sidewalls of the trenches 14 by this thermal oxidation treatment. As for the interface of the silicon oxide film 15A and the N− type semiconductor layer 12, the corner portions 12C and 12D of the N− type semiconductor layer 12 at the upper ends of the sidewalls of the trenches 14 are round (i.e. curved).

When other high breakdown voltage MOS transistor is formed on the same N− type semiconductor layer 12, the silicon oxide film 15A is formed simultaneously with the gate oxide film of this transistor. The thickness of the silicon oxide film 15A depends on the breakdown voltage characteristics of the MOS transistor.

Figure 5A:
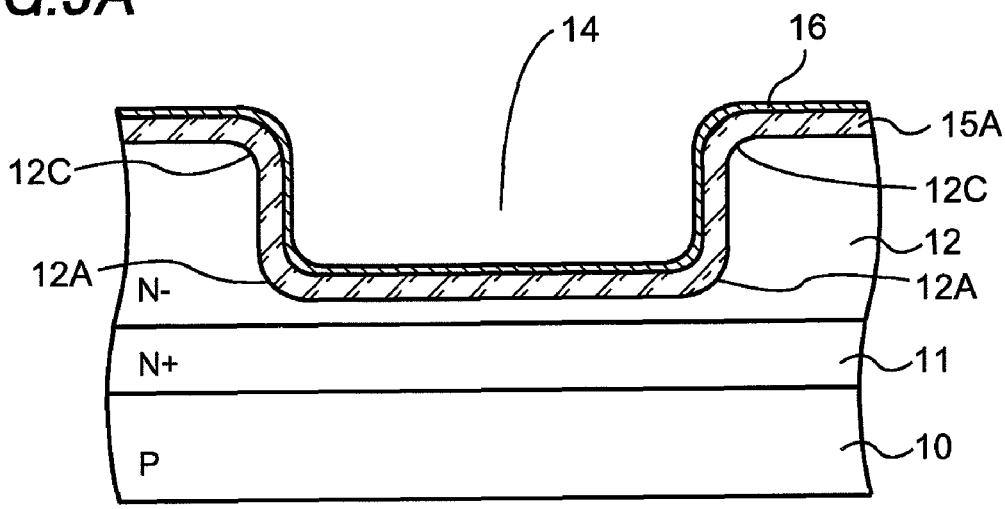
Figure 5B:
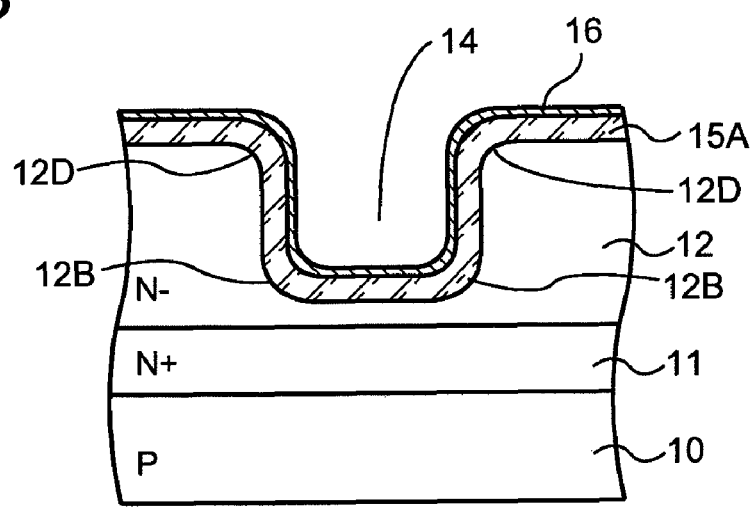

Then, as shown in FIG. 5, a photoresist reinforcement film 16 is formed on the silicon oxide film 15A including in the trenches 14 by a CVD method or the like. The photoresist reinforcement film 16 prevents the silicon oxide film 15A to be left from being removed by etching solution entering the interface of a photoresist layer R2 and the silicon oxide film 15A in a wet etching process described below. The photoresist reinforcement film 16 is preferably made of a silicon nitride film and the thickness is about 60 nm.

Figure 6A:
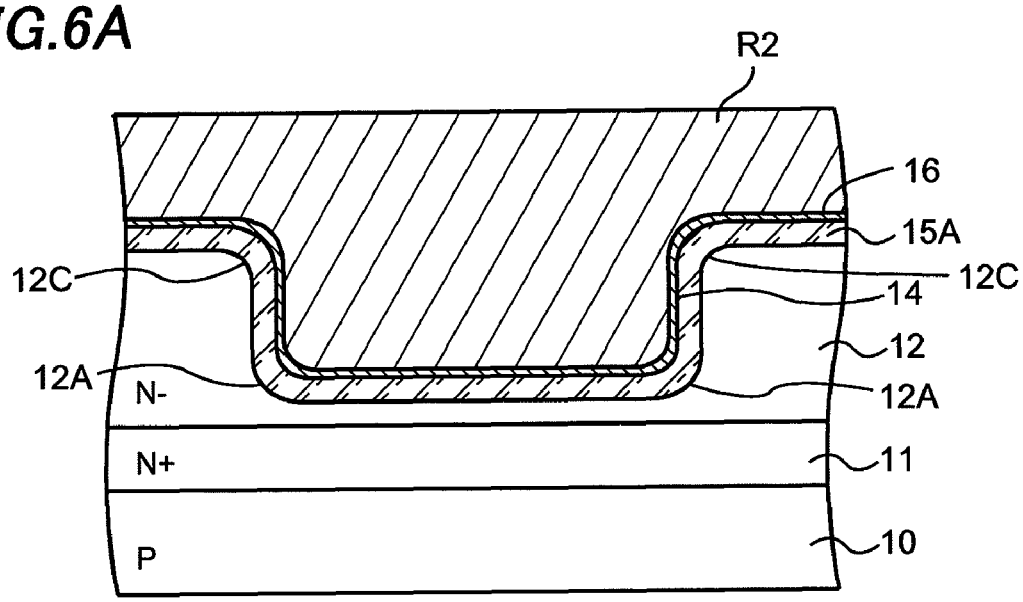
Figure 6B:
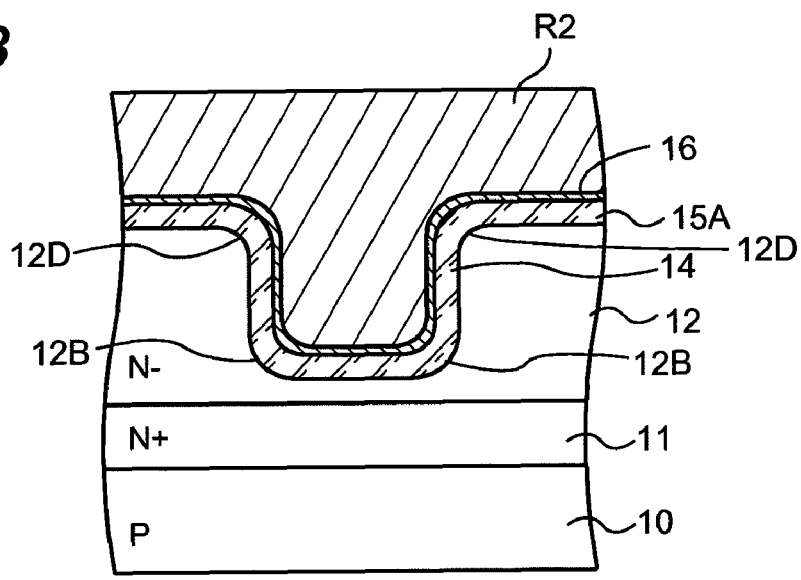
Figure 7A:
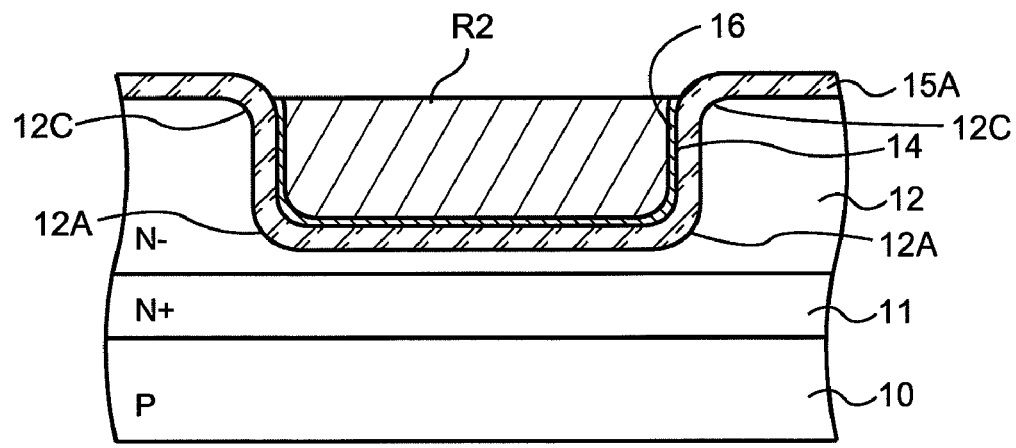
Figure 7B:
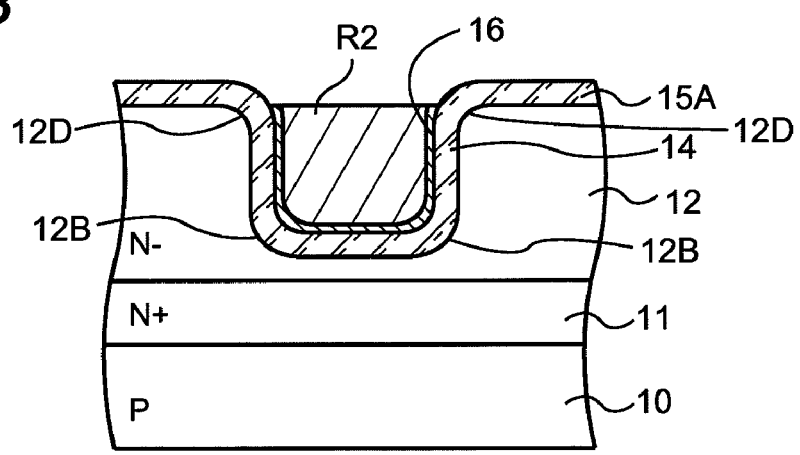

Then, as shown in FIG. 6, a photoresist layer R2 is formed on the photoresist reinforcement film 16 including in the trenches 14. Then, as shown in FIG. 7, the photoresist layer R2 and the photoresist reinforcement film 16 are partially etched back and removed. By this process, the photoresist layer R2 and the photoresist reinforcement film 16 remain only in the trenches 14, and the silicon oxide film 15A is exposed from the end portions of the trenches 14 onto the outside thereof.

Figure 8A:
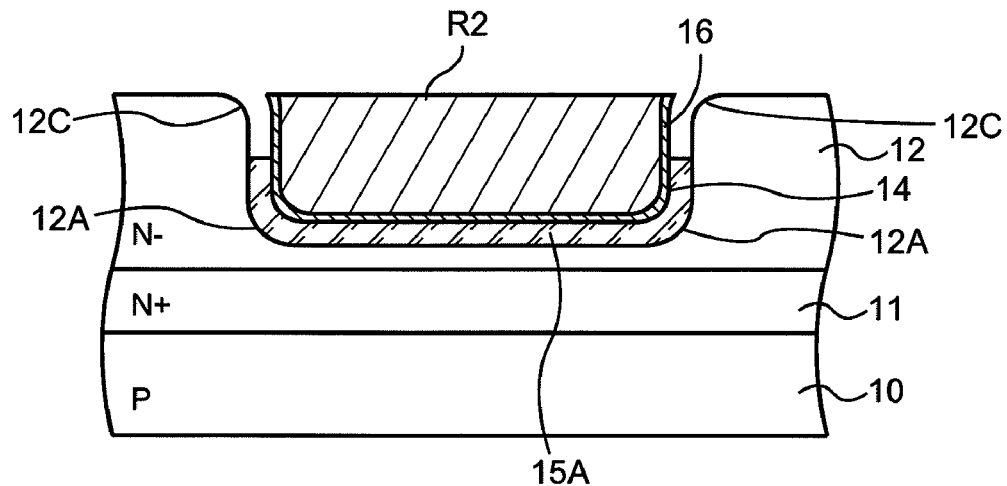
Figure 8B:
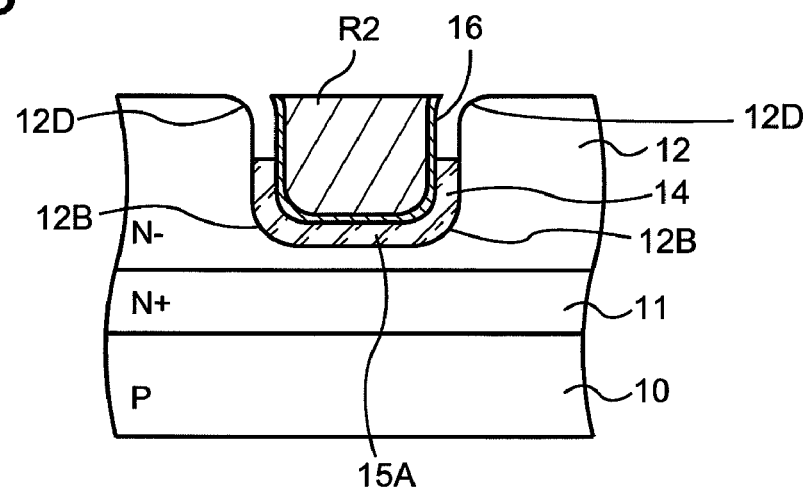
Figure 9A:
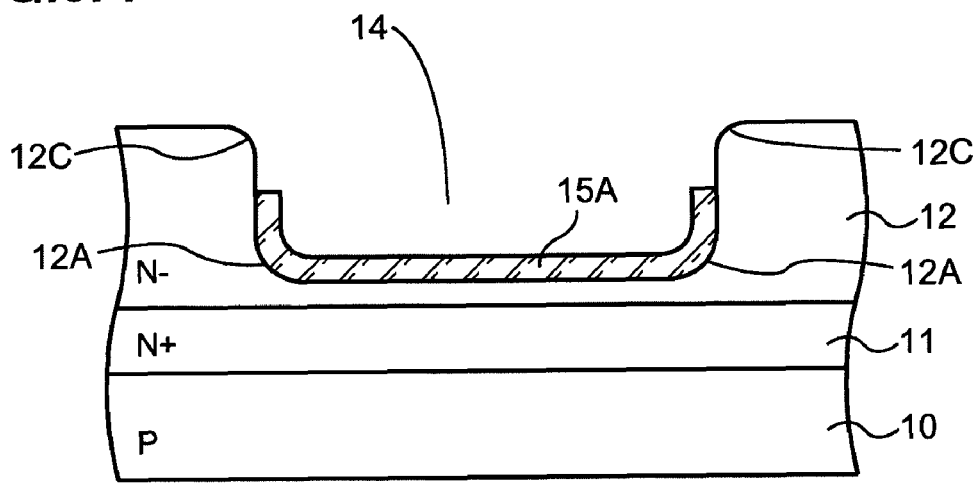
Figure 9B:
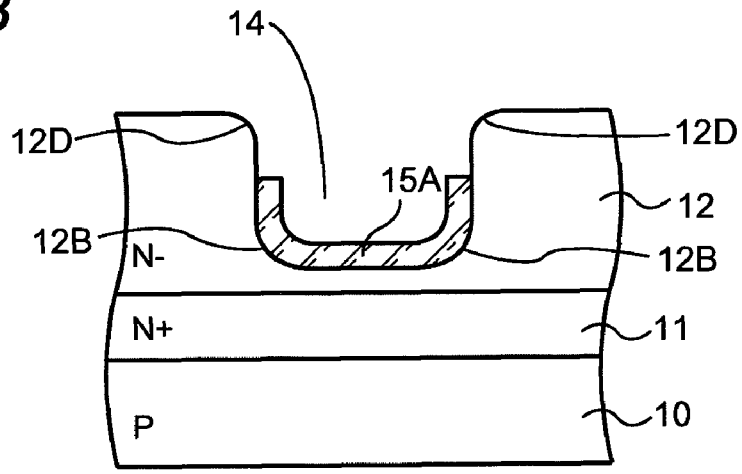

Then, as shown in FIG. 8, the exposed silicon oxide film 15A is etched using the photoresist layer R2 and the photoresist reinforcement film 16 as a mask. This etching is preferably wet etching using hydrofluoric acid type etching solution or the like. By this process, the silicon oxide film 15A is removed on the front surface of the N− type semiconductor layer 12 and from the upper portions of the sidewalls of the trenches 14 (i.e. in the region near the opening portions of the trenches 14) onto the outside of the trenches 14, thereby exposing the N− type semiconductor layer 12 there. The region of the silicon oxide film 15A removed in the trenches 14 is about 600 nm to 1 μm from the opening portions of the trenches 14 toward the bottoms. Then, as shown in FIG. 9, the photoresist layer R2 and the photoresist reinforcement film 16 are removed.

Figure 10A:
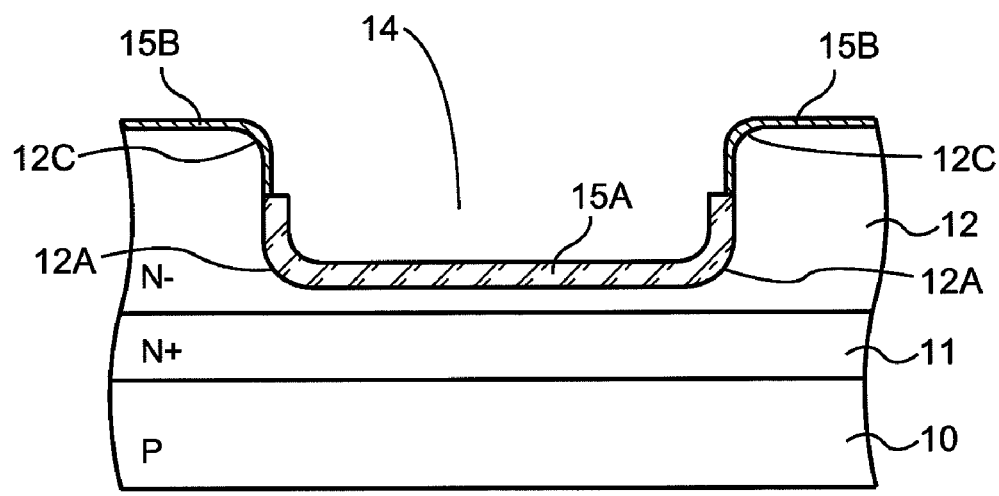
Figure 10B:
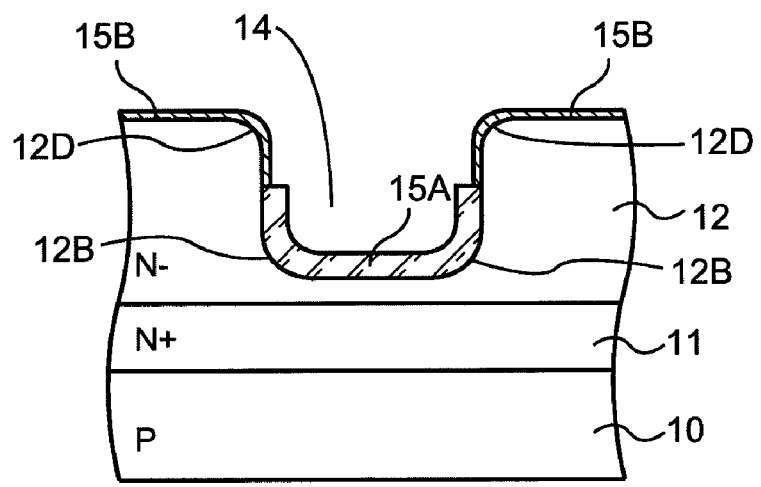

Then, as shown in FIG. 10, a thermal oxidation treatment is performed to the N− type semiconductor layer 12 to form a silicon oxide film 15B from the upper portions of the sidewalls of the trenches 14 onto the outside of the trenches 14, which is thinner than the silicon oxide film 15A on the bottoms of the trenches 14. The silicon oxide film 15B on the upper end portions of the sidewalls of the trenches 14 is formed to be round (i.e. curved), reflecting the round corner portions 12C and 12D of the N− type semiconductor layer 12.

The silicon oxide film 15A and the silicon oxide film 15B function as a gate insulation film.

The thickness of the thin silicon oxide film 15B on the upper portions of the sidewalls of the trenches 14 (an example of a first thickness of the invention) is about 7 to 20 nm, and preferably about 15 nm. The thickness of the silicon oxide film 15A on the bottoms of the trenches 14 (an example of a second thickness of the invention) is about 50 to 200 nm, and preferably about 100 nm.

Figure 11A:
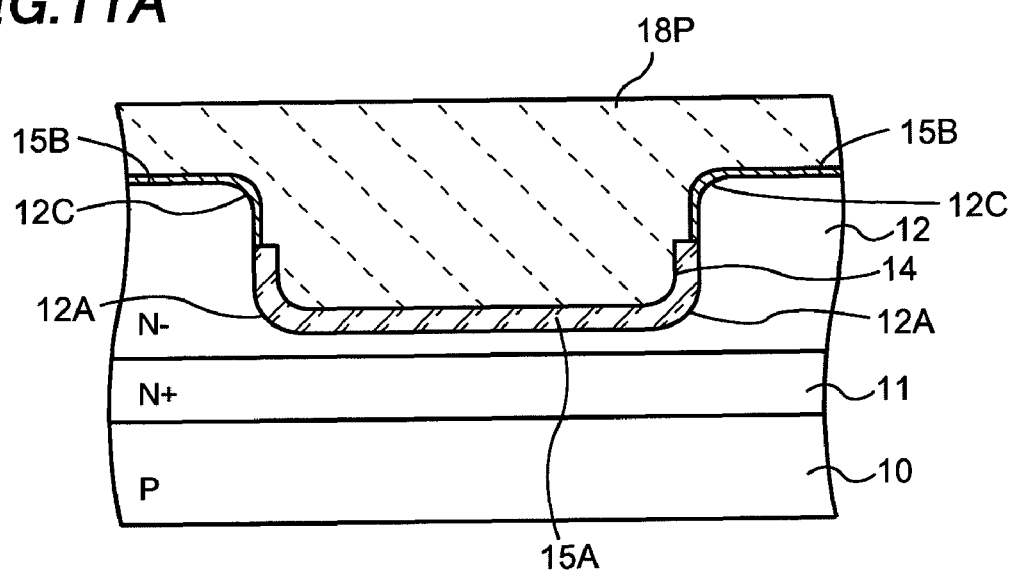
Figure 11B:
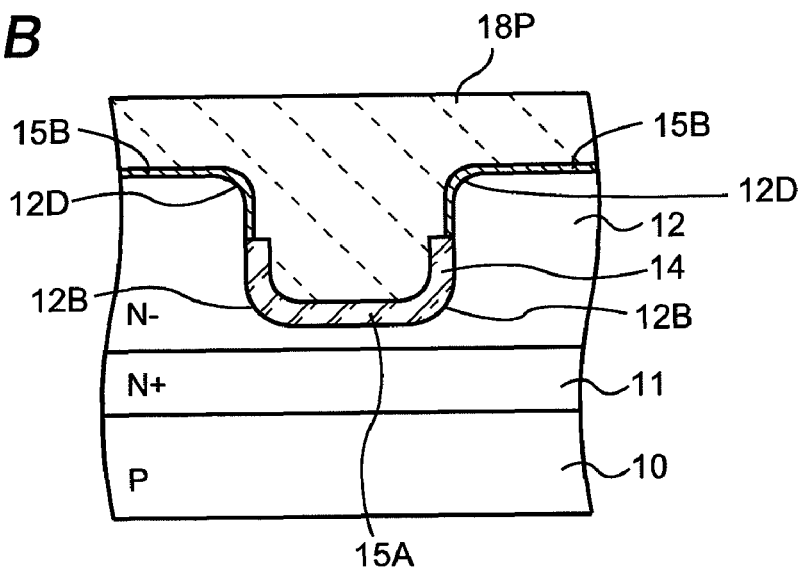

Then, as shown in FIG. 11, a polysilicon layer 18P is formed covering the silicon oxide film 15A and the silicon oxide film 15B, and impurities are doped therein. The impurities are preferably of an N type impurity.

Figure 12A:
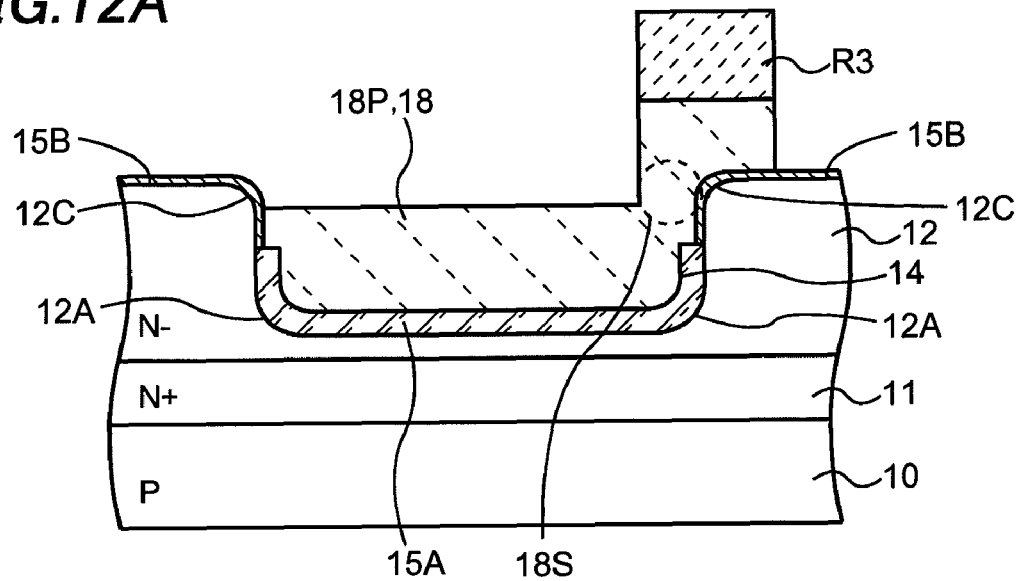
Figure 12B:
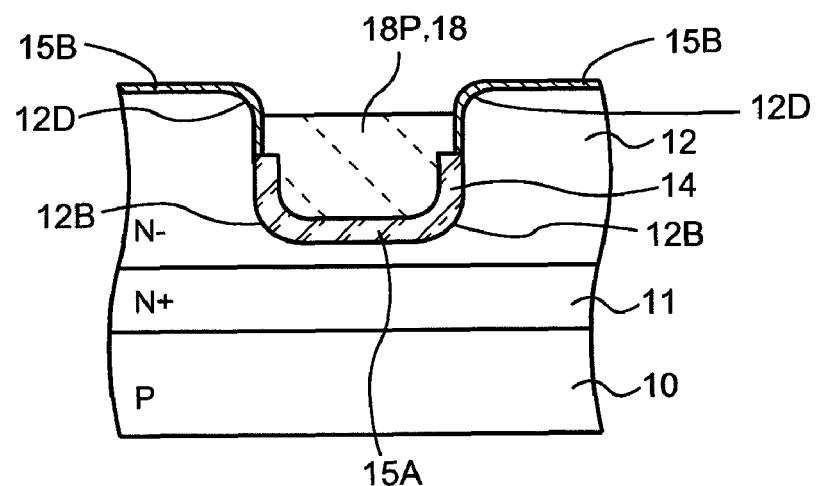

Next, as shown in FIG. 12, a photoresist layer R3 is formed on the polysilicon layer 18P in a region partially overlapping the end portions of the trenches 14. Then, the polysilicon layer 18P is etched using the photoresist layer R3 as a mask to form the gate electrodes 18 extending from inside the trenches 14 onto the end portions of the trenches on the outside. The leading portions 18S of the gate electrodes 18 extending from inside the trenches 14 onto the outside contact the thin silicon oxide film 15B at the round corner portions 12C. Furthermore, the gate electrodes 18 are connected to each other on the silicon oxide film 15B on the outside of the trenches 14. This etching is plasma etching, for example. The photoresist layer R3 is then removed.

Figure 13A:
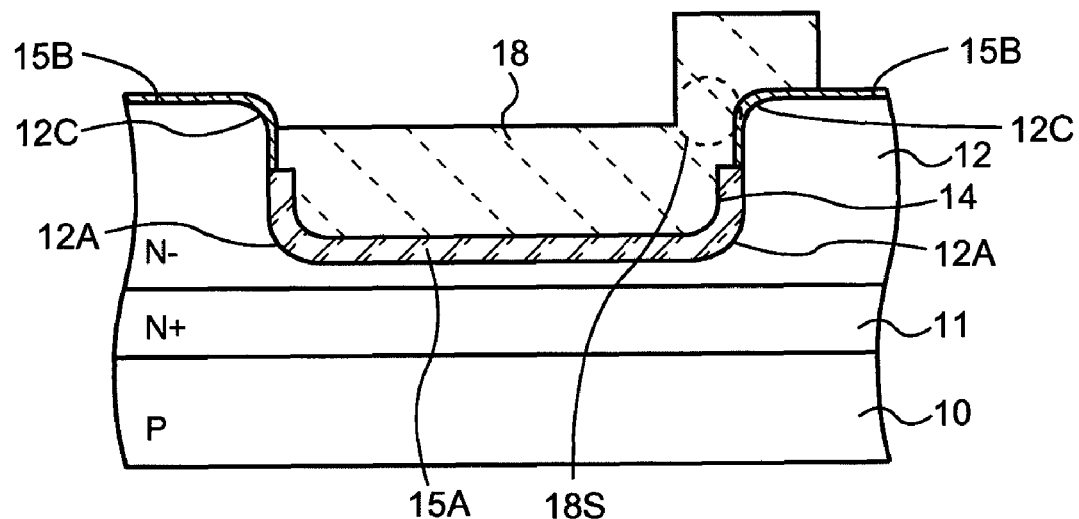
Figure 13B:
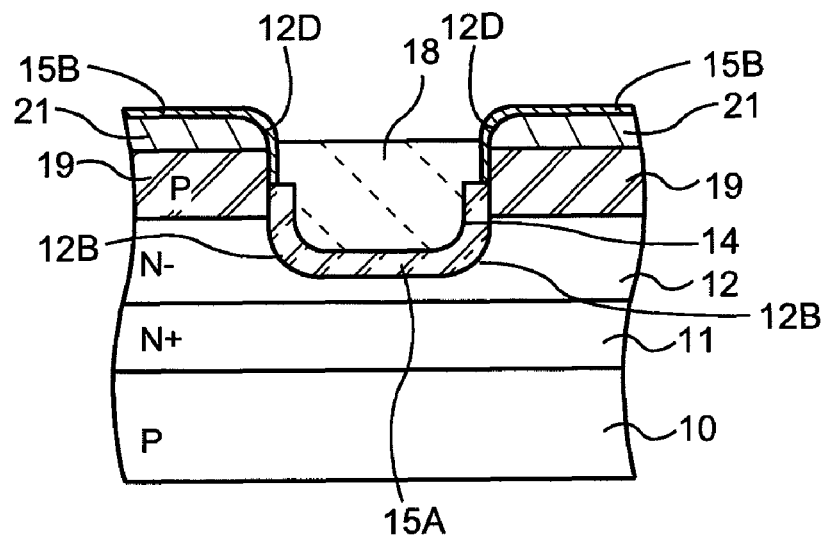

Then, as shown in FIG. 13, P type impurities are ion-implanted in the N– type semiconductor layer 12 around each of the trenches 14 in the vertical direction to form the P type body layer 19. Furthermore, N type impurities are ion-implanted in the front surface of the body layer 19 along the long sides of the trenches 14 to form a source layer 21. It is preferable to perform a heat treatment for the activation and the modulation of the impurity distributions of the body layer 19 and the source layer 21.

Then, as shown in FIG. 14, an interlayer insulation film 24 is formed covering the silicon oxide film 15B and the gate electrodes 18. Wiring layers 25 are formed on the interlayer insulation film 24, being connected to the gate electrodes 18 through the contact holes H1 provided in the interlayer insulation film 24. Furthermore, source electrodes 23 are formed on the interlayer insulation film 24, being connected to the source layer 21 through contact holes H2 provided in the silicon oxide film 15B and the interlayer insulation film 24.

In the transistor thus completed, when a potential of the threshold or more is applied from the wiring layers 25 to the gate electrodes 18, the surface of the body layer 19 on the sidewalls of the trenches 14 is inverted into the N type to form channels. Therefore, current flows between the source electrodes 23 and the N– type semiconductor layer 12 and the N+ type semiconductor layer 11 as a drain D.

Since the silicon oxide film 15A is formed thick on the bottoms of the trenches 14 and the sidewalls near the bottoms, the gate capacitance (of the gate electrode 18, the silicon oxide film 15A and the N– type semiconductor layer 12) is reduced.

Furthermore, since the corner portions 12A and 12B of the N– type semiconductor layer 12 are formed to be round, on the bottoms of the trenches 14 and the sidewalls near the bottoms, the N– type semiconductor layer 12 does not easily have crystal defects, and the thickness of the silicon oxide film 15A becomes constant and the gate electric field is dispersed so that the reduction of the gate breakdown voltage is prevented.

On the other hand, since the thin silicon oxide film 15B is formed as the gate insulation film on the active region (the region formed with the body layer 19) of the transistor on the upper portions of the sidewalls of the trenches 14, good transistor characteristics (low threshold, low on-resistance) are obtained.

Furthermore, since the silicon oxide film 15B is formed to be round on the upper ends of the sidewalls of the trenches 14 near the leading portions 18S of the gate electrodes 18, reflecting the corner portions 12C and 12D of the N– type semiconductor layer 12, the gate leakage current between the gate electrodes 18 and the N– type semiconductor layer 12 is reduced.

Figure 15:
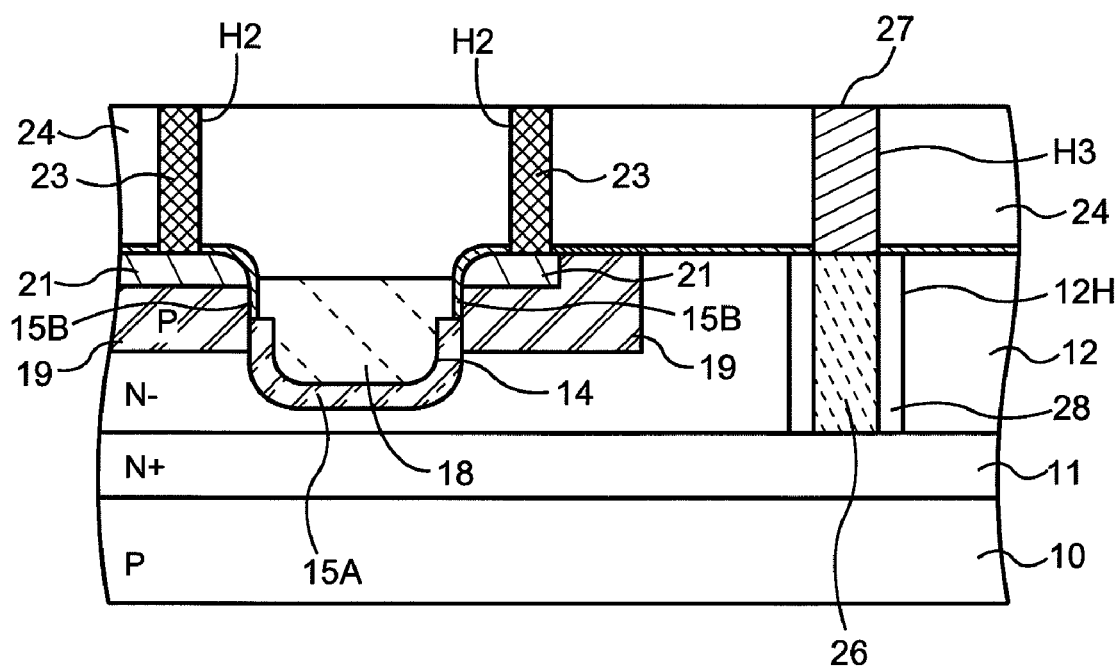

As a modification of the embodiment, as shown in FIG. 15, a drain leading portion 26 and a drain electrode 27 may be formed. In this case, before the interlayer insulation film 24 is formed, an opening 12H is formed in the N– type semiconductor layer 12, an insulation film 28 is formed in the opening 12H, and the drain leading portion 26 is embedded therein. Then, the interlayer insulation film 24 is formed, a penetration hole H3 is formed penetrating the interlayer insulation film 24, and the drain electrode 27 is formed in the penetration hole H3, being connected to the drain leading portion 26.

Figure 16:
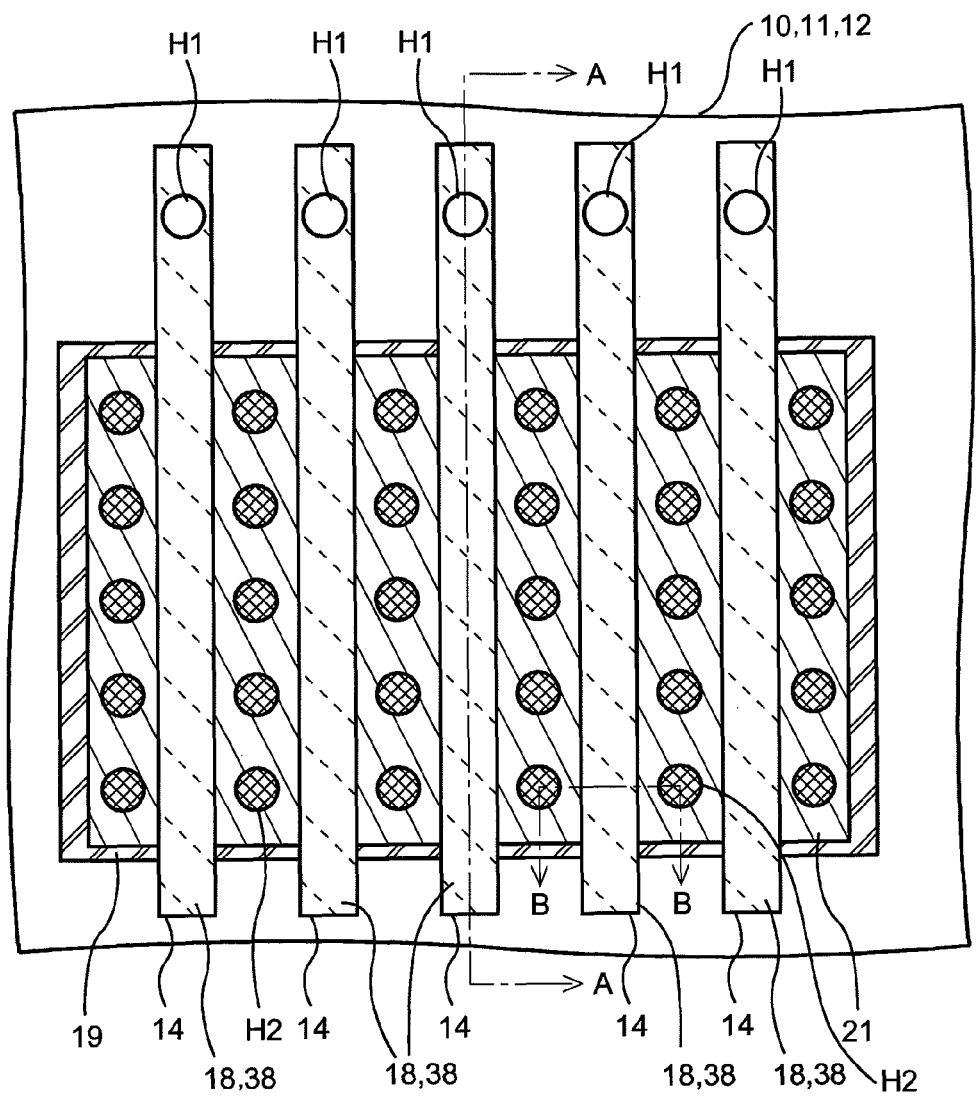
Figure 17A:
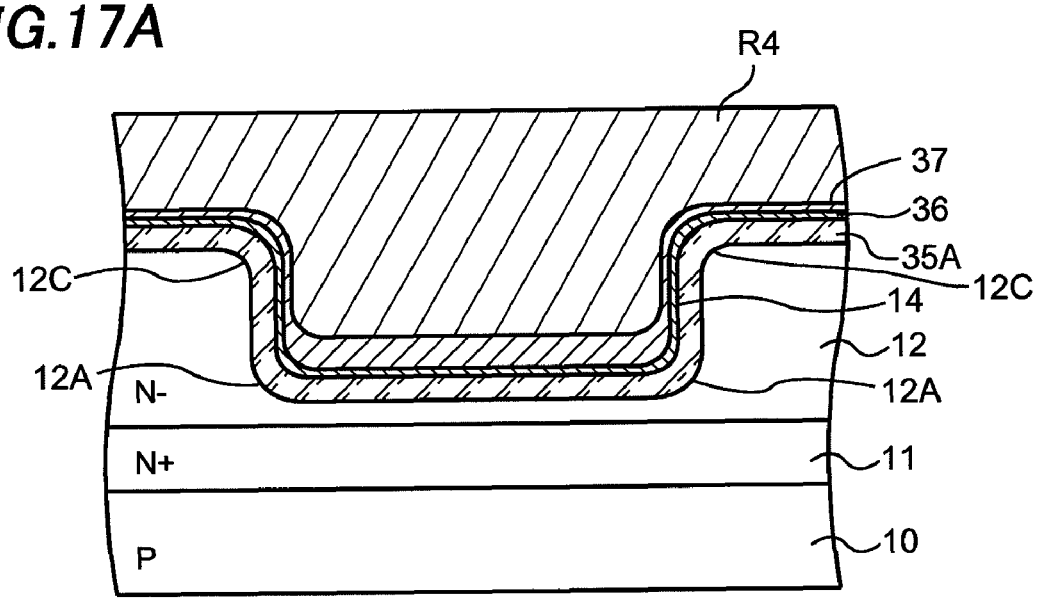
FIGS. 17 to 26 are cross-sectional views for explaining the trench gate type transistor and the method of manufacturing the same of the second embodiment of the invention.
Figure 17B:
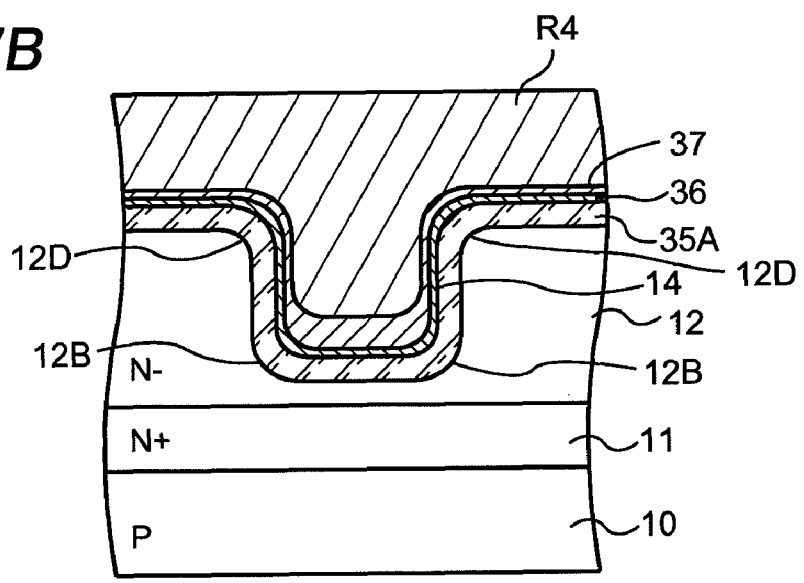

Furthermore, as other modification of the embodiment, the gate electrodes 18 may be formed separately and isolatedly in the ends of the trenches 14 respectively as shown in the plan view of FIG. 16 instead of being connected to each other in the ends of the trenches 14 as shown in FIG. 1. The other structure is the same as that of FIG. 1. With this structure, when the plasma etching is performed to etch the polysilicon layer 18P, since the area of the gate electrodes 18 made of the polysilicon layer 18P is reduced, plasma damage to the gate electrodes 18 is minimized. Therefore, the reliability of the transistor is enhanced.

Second Embodiment

A second embodiment of the invention will be described referring to figures. The schematic plan structure of this transistor is the same as that of FIG. 1.

Hereafter, a trench gate type transistor and a method of manufacturing the same of the embodiment will be described referring to figures. FIGS. 17(A) to 26(A) are cross-sectional views of FIG. 1 along line A-A, and FIGS. 17(B) to 26(B) are cross-sectional views of FIG. 1 along line B-B. In FIGS. 17 to 26, the same numerals are given to the same elements as those of FIGS. 2 to 14.

First, in the similar manner to the processes shown in FIGS. 2 to 5 in the first embodiment, an N+ type semiconductor layer 11 and an N– type semiconductor layer 12 are formed on a semiconductor substrate 10, and trenches 14 are formed in the N– type semiconductor layer 12. A silicon oxide film 35A which corresponds to the silicon oxide film 15A, and a photoresist reinforcement film 36 which corresponds to the photoresist reinforcement film 16 are formed on the N– type semiconductor layer 12 including in the trenches 14.

When other high breakdown voltage MOS transistor is formed on the same N– type semiconductor layer 12, the silicon oxide film 35A is formed simultaneously with the gate oxide film of this transistor. The thickness of the silicon oxide film 35A depends on the breakdown voltage characteristics of the MOS transistor.

Then, as shown in FIG. 17, a BARC (Bottom Anti-Reflection Coating) 37 which is an anti-reflection layer is formed on the photoresist reinforcement film 36 including in the trenches 14. A photoresist layer R4 is further formed on the BARC 37 including in the trenches 14. The BARC 37 sets after it is formed as fluid and is not removed in a photolithography process of the photoresist layer R4 in its properties. Due to these properties, the BARC 37 is formed to have a larger thickness on the bottoms of the trenches 14 than the thickness from the upper portions of the sidewalls onto the outside of the trenches 14. Other material may be formed instead of the BARC 37 as long as it has such properties. For example, when the photoresist layer R4 is of a positive type photoresist layer, a negative type photoresist layer may be formed instead of the BARC 37.

Figure 18A:
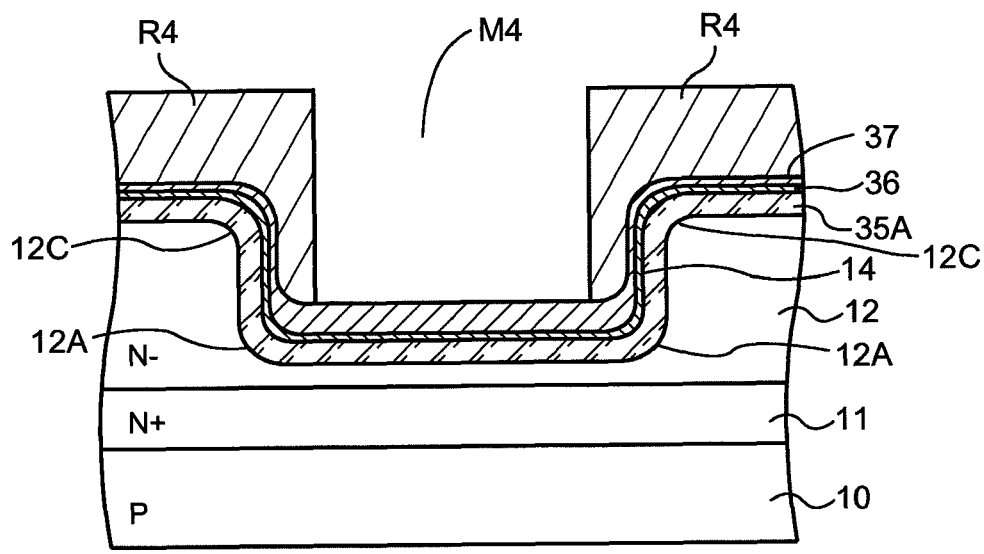
Figure 18B:
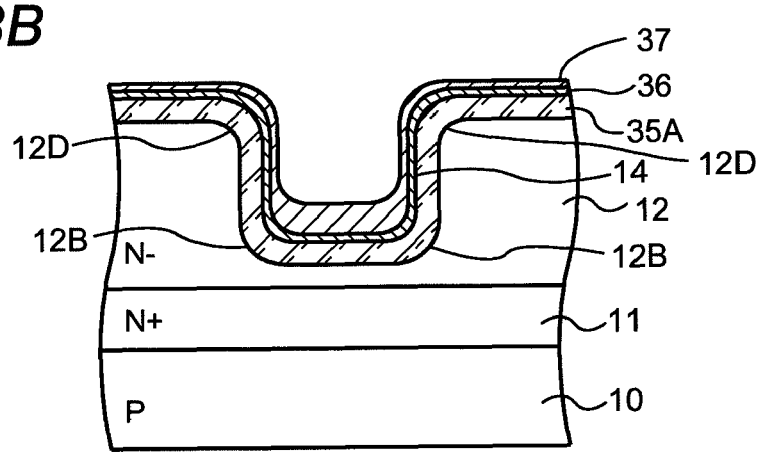

Then, as shown in FIG. 18, an opening M4 is provided in the photoresist layer R4 by a photolithography process, i.e., exposure and development. The opening M4 is located on a region of the N− type semiconductor layer 12 for the active region of the transistor. The active region of the transistor is a region including a region for forming a body layer 19. Hereafter, the active region of the transistor is referred to as an active region simply.

Figure 19A:
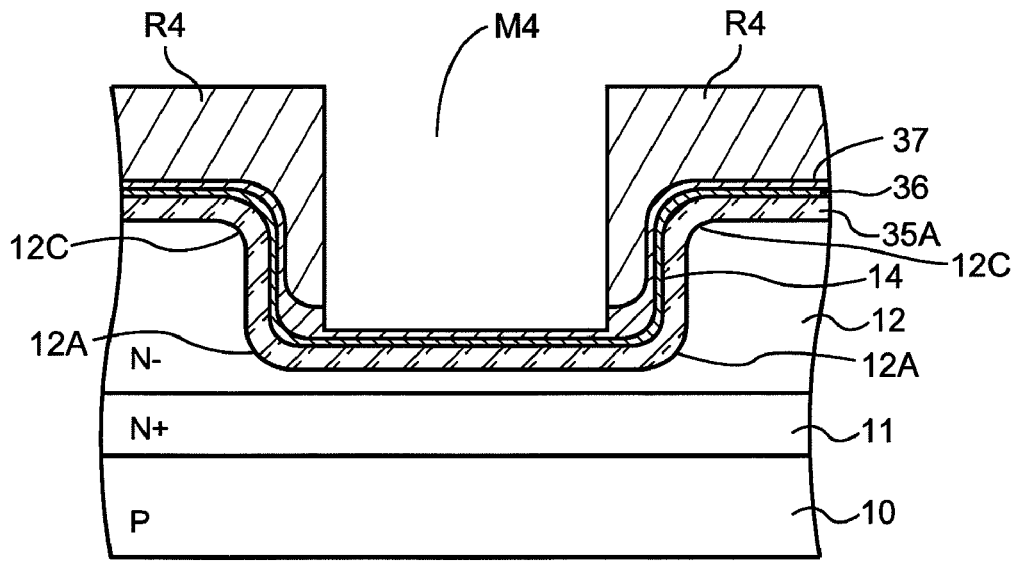
Figure 19B:
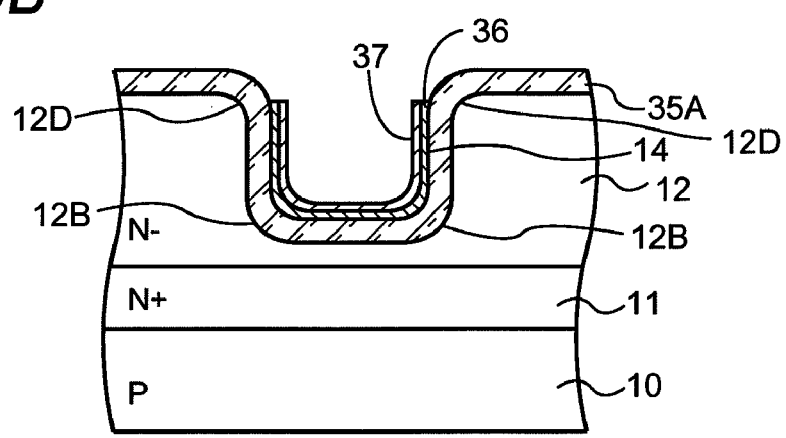

Then, as shown in FIG. 19, the photoresist reinforcement film 36 and the BARC 37 are etched and removed using the photoresist layer R4 as a mask. In this etching, the photoresist reinforcement film 36 and the BARC 37 are removed on the active region on the outside of the trenches 14 to expose the silicon oxide film 35A. On the other hand, the photoresist reinforcement film 36 and the BARC 37 remain in the trenches 14. This is because that since the thickness of the BARC 37 differs between inside the trenches 14 and on the outside of the trenches 14, the BARC 37 on the outside of the trenches 14 is removed by etching before the BARC 37 on the bottoms of the trenches 14, which is thicker than the BARC 37 on the outside.

In a case of the photoresist layer R4 of a positive type, when the opening M4 is provided by the photolithography process shown in FIG. 18, the BARC 37 as an anti-reflection layer prevents diffuse reflection of light on the bottoms of the trenches 14, so that the photoresist layer R4 is easily left on the BARC 37 in the desired region. Then, the etching of the BARC 37 in the trenches 14 is surely delayed compared with the etching of the BARC 37 on the outside of the trenches 14.

Figure 20A:
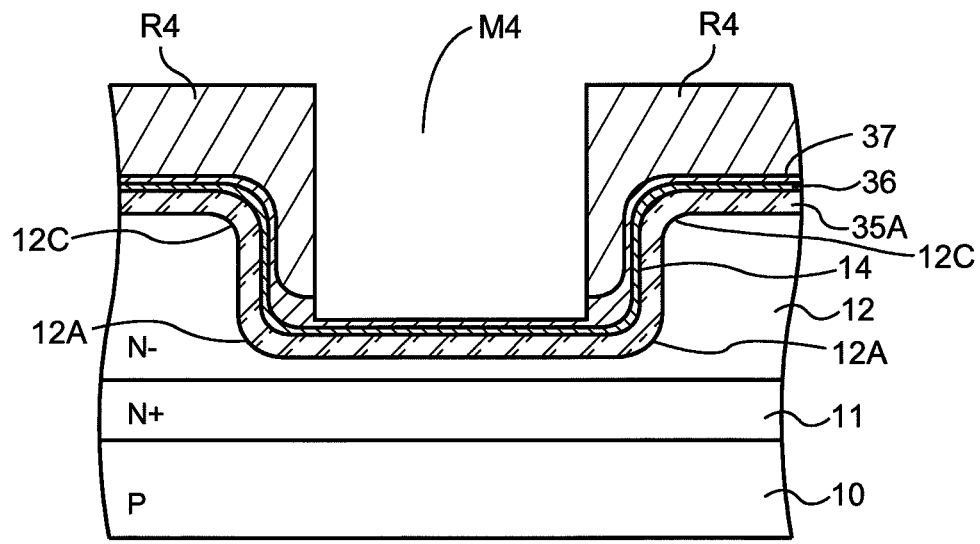
Figure 20B:
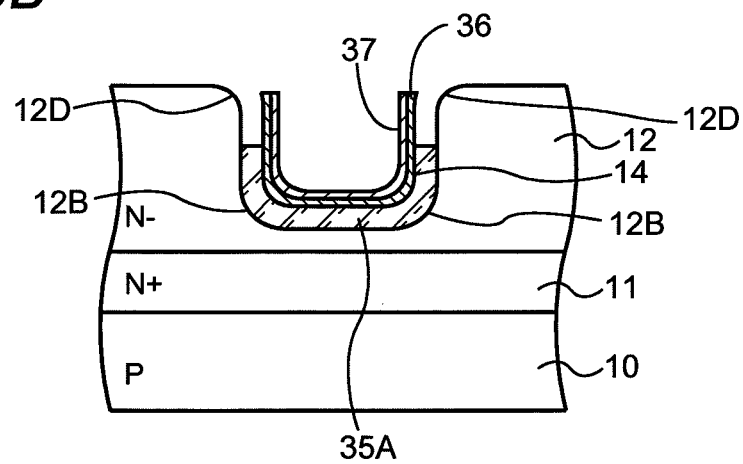
Figure 21A:
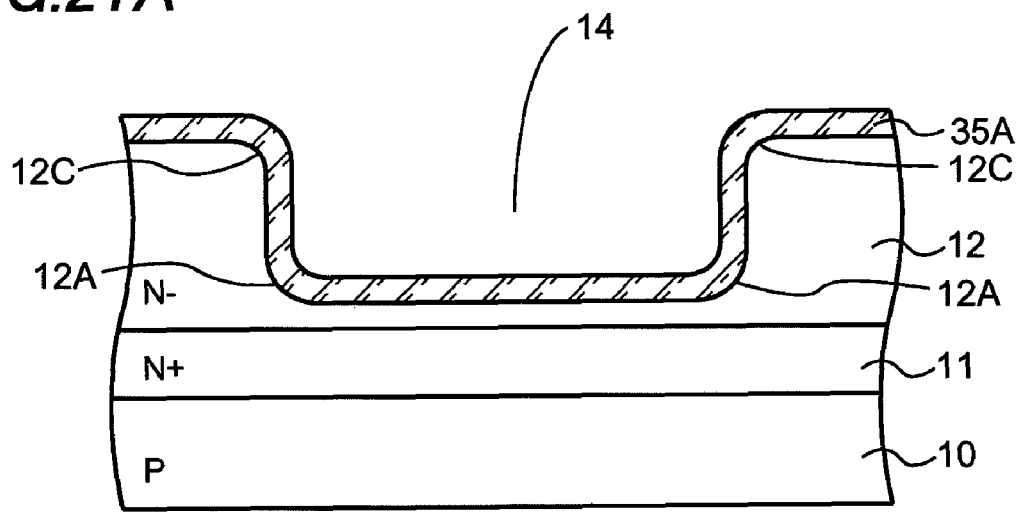
Figure 21B:
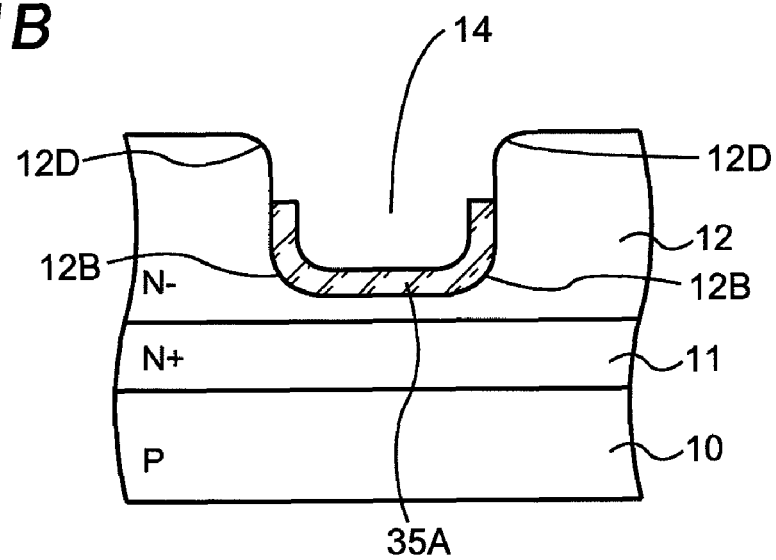

Then, as shown in FIG. 20, the silicon oxide film 35A is etched using the photoresist layer R4, and the photoresist reinforcement film 36 and the BARC 37 inside the trenches 14 as a mask. By this process, the silicon oxide film 35A on the front surface of the N− type semiconductor layer 12 on the outside of the trenches 14 and on the upper portions of the sidewalls of the trenches 14 (i.e. the region near the opening portions of the trenches 14) is removed. The region of the silicon oxide film 35A removed in the trenches 14 is about 600 nm to 1 μm from the opening portions of the trenches 14 toward the bottoms. The photoresist layer R4, the photoresist reinforcement film 36 and the BARC 37 are then removed as shown in FIG. 21.

Figure 22A:
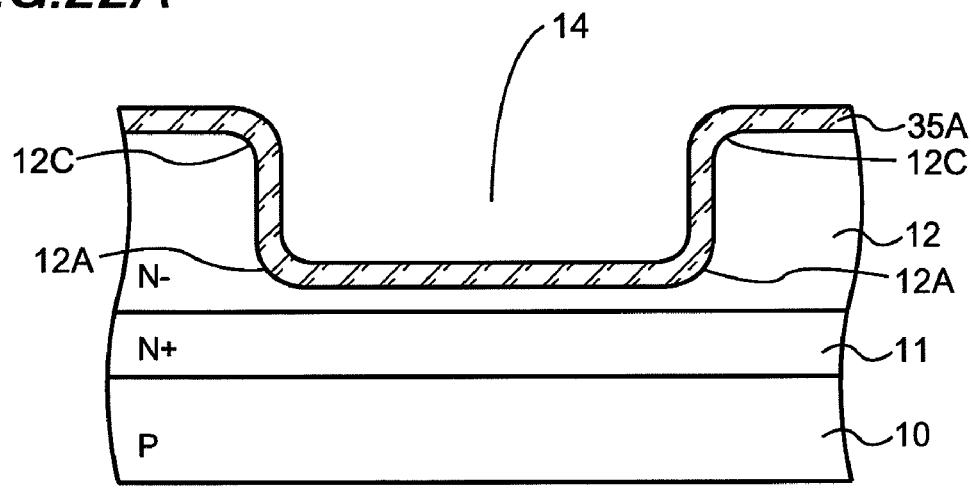
Figure 22B:
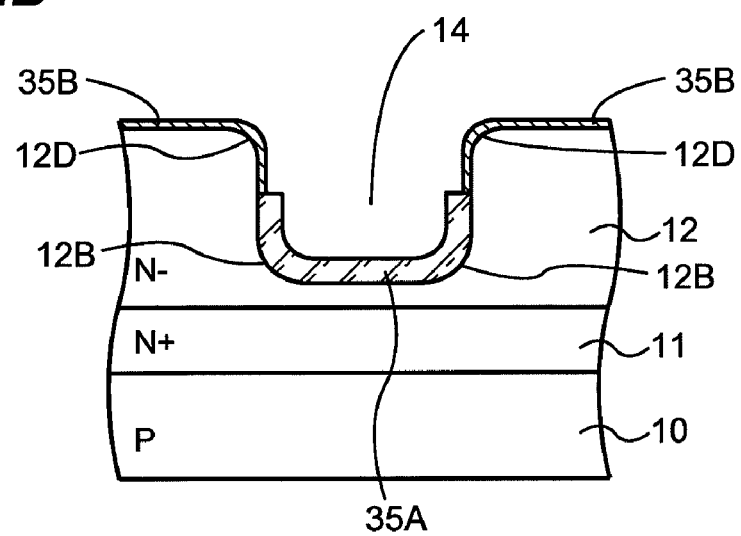

Then, as shown in FIG. 22, a silicon oxide film 35B is formed on the active region from the upper portions of the sidewalls of the trenches 14 onto the outside of the trenches 14 along the long sides of the trenches 14 by a thermal oxidation treatment, which is thinner than the silicon oxide film 35A on the bottoms of the trenches 14. The silicon oxide film 35A on the upper ends of the sidewalls of the trenches 14 along the short sides increases in thickness, and is formed to be round (i.e. curved), reflecting the round corner portions 12C of the N− type semiconductor layer 12. The silicon oxide film 35A and the silicon oxide film 35B function as a gate insulation film.

The thickness of the thin silicon oxide film 35B (an example of the first thickness of the invention) is about 7 to 20 nm, and preferably about 15 nm. Furthermore, the thickness of the thick silicon oxide film 35A (an example of the second thickness of the invention) is about 50 to 200 nm, and preferably about 100 nm.

Figure 23A:
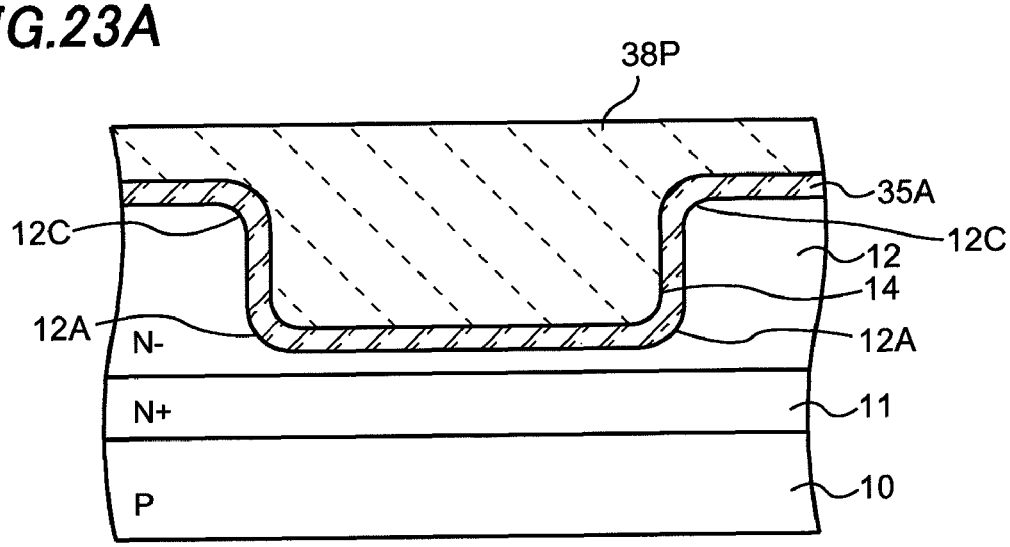
Figure 23B:
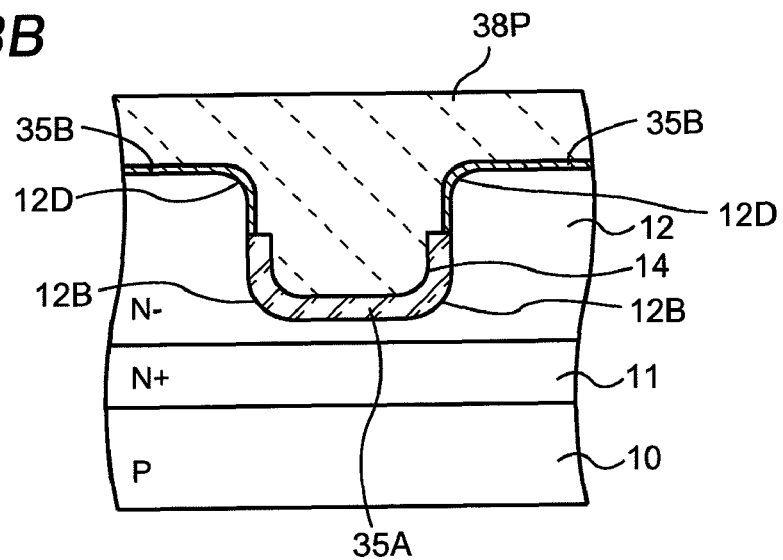

Then, as shown in FIG. 23, a polysilicon layer 38P is formed covering the silicon oxide film 35A and the silicon oxide film 35B, and impurities are doped therein. The impurities are preferably of an N type impurity.

Figure 24A:
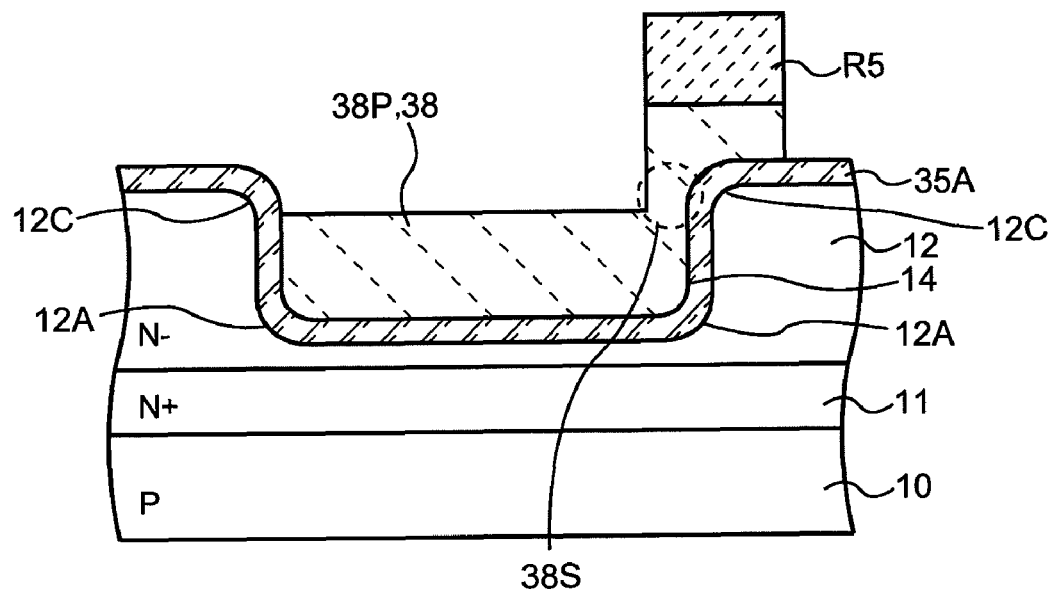
Figure 24B:
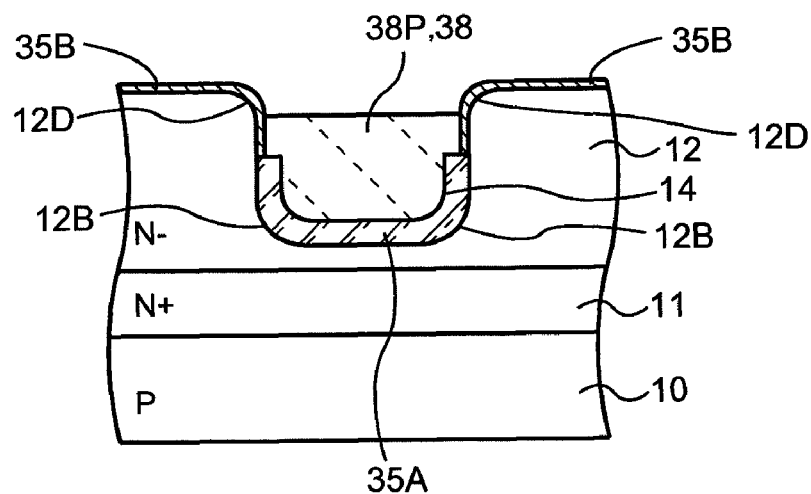

Then, as shown in FIG. 24, a photoresist layer R5 is formed on the polysilicon layer 38P in a region partially overlapping the end portions of the trenches 14. Then, the polysilicon layer 38P is etched using the photoresist layer R5 as a mask to form gate electrodes 38 extending from inside the trenches 14 onto the end portions of the trenches 14 on the outside. The leading portions 38S of the gate electrodes 38 extending from inside the trenches 14 onto the outside thereof contact the thick silicon oxide film 35A at the round corner portions 12C. The gate electrodes 38 are connected to each other on the outside of the trenches 14. This etching is plasma etching, for example. The photoresist layer R5 is then removed.

Figure 25A:
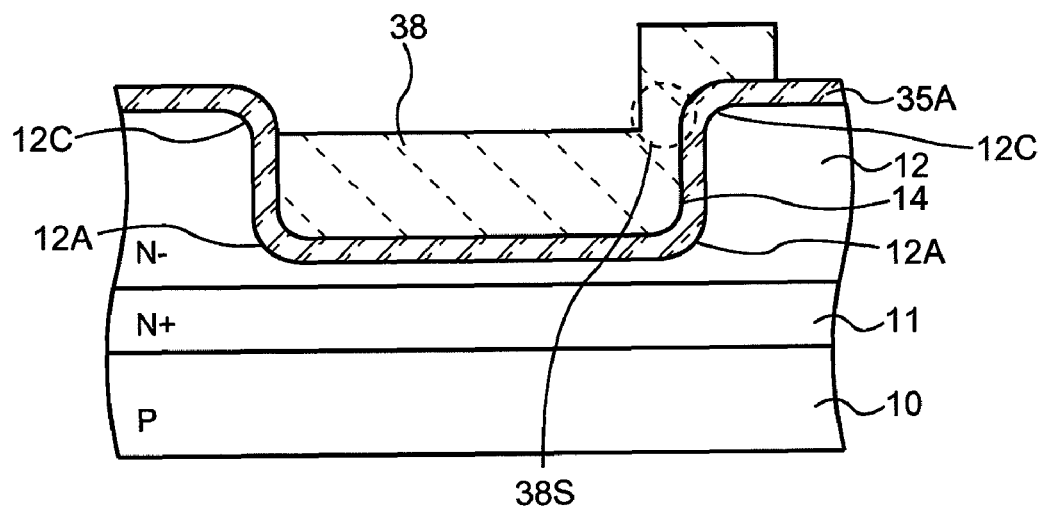
Figure 25B:
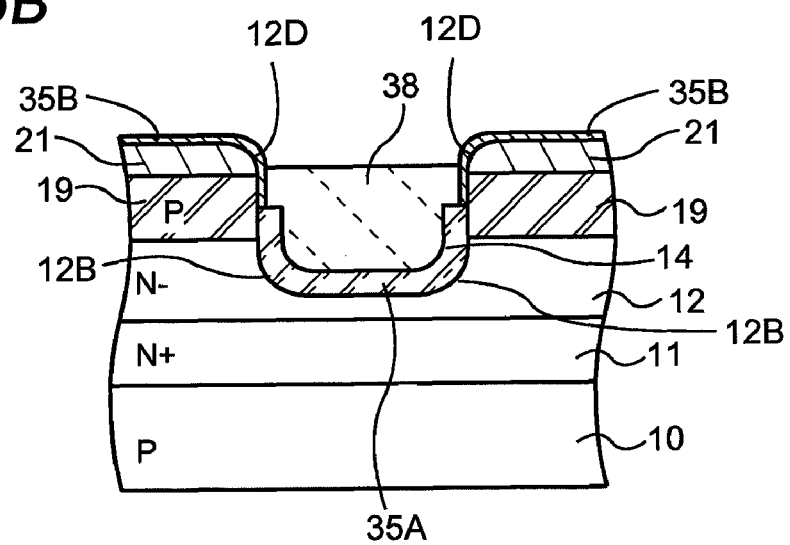
Figure 26A:
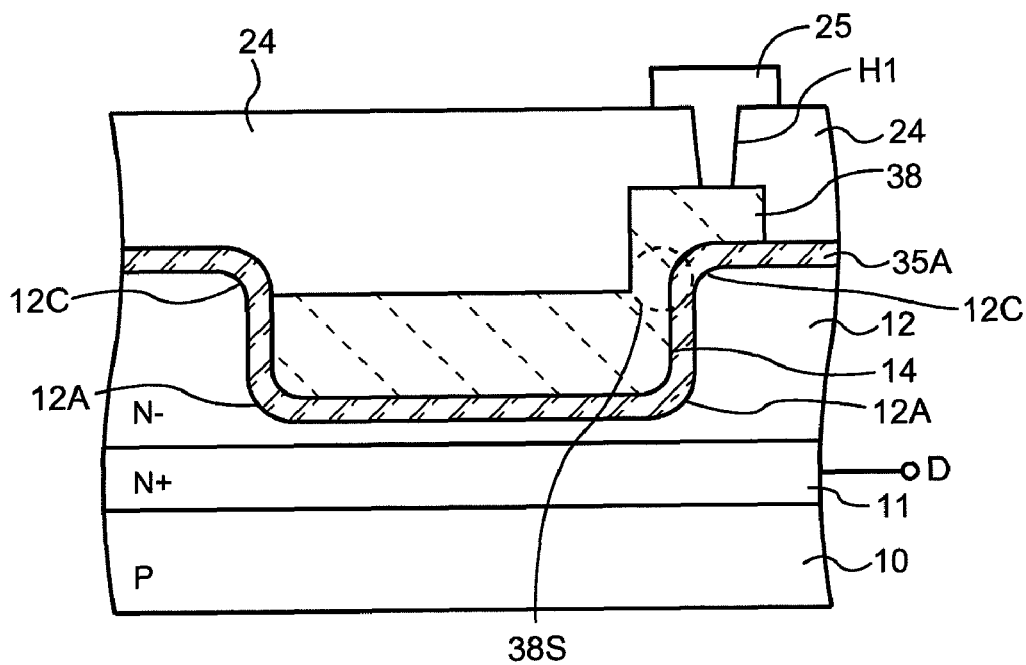
Figure 26B:
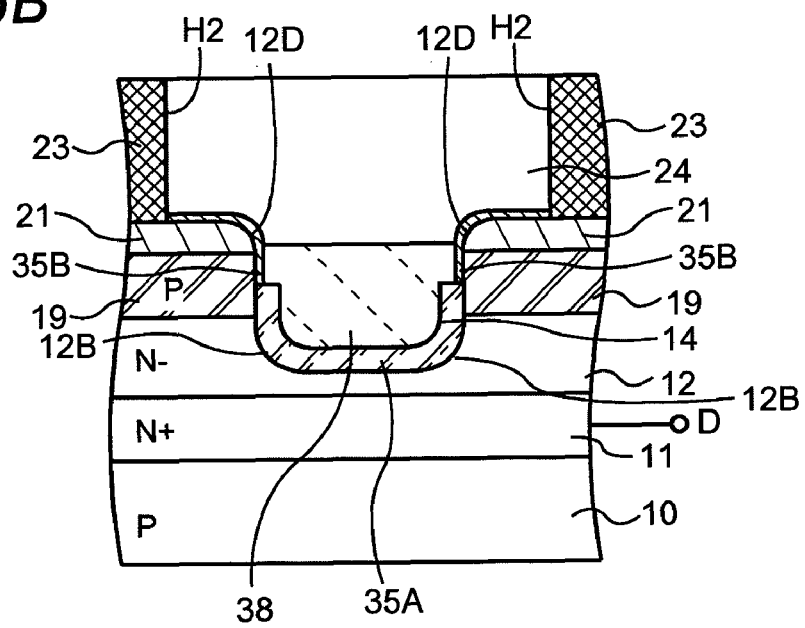
Figure 27:
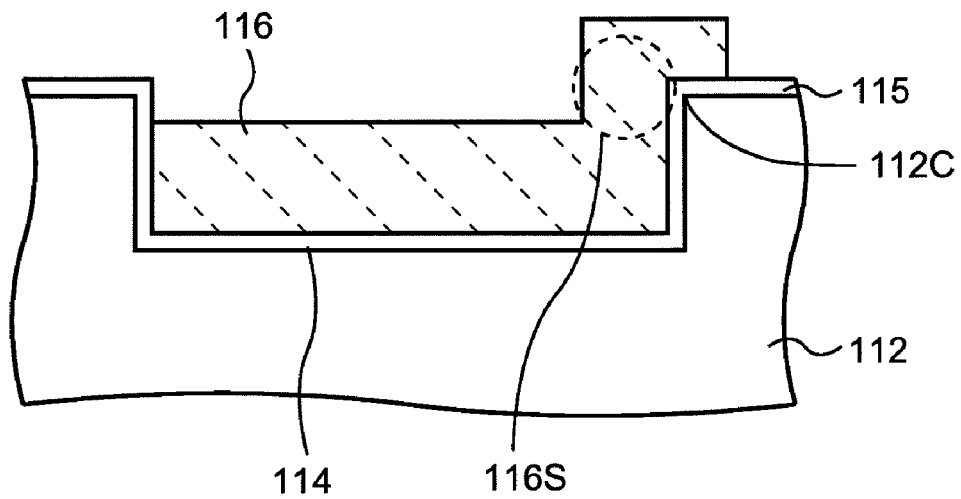
FIG. 27 is a cross-sectional view for explaining a conventional trench gate type transistor and a method of manufacturing the same.

Then, as shown in FIG. 25, in the similar manner to the first embodiment, the body layer 19 is formed in the N− type semiconductor layer 12. Furthermore, a source layer 21 is formed in the front surface of the body layer 19. It is preferable to perform a heat treatment for the activation and the modulation of the impurity distributions of the body layer 19 and the source layer 21.

Then, as shown in FIG. 26, an interlayer insulation film 24 is formed covering the silicon oxide films 35A and 35B and the gate electrodes 38. Wiring layers 25 are formed on the interlayer insulation film 24, being connected to the gate electrodes 38 through contact holes H1 provided in the interlayer insulation film 24. Furthermore, source electrodes 23 are formed on the interlayer insulation film 24, being connected to the source layer 21 through contact holes H2 provided in the silicon oxide film 35B and the interlayer insulation film 24.

In the transistor thus completed, when a potential of the threshold or more is applied from the wiring layers 25 to the gate electrodes 38, the surface of the body layer 19 on the sidewalls of the trenches 14 is inverted into the N type to form channels. Therefore, current flows between the source electrodes 23 and the N− type semiconductor layer 12 and the N+ type semiconductor layer 11 as a drain D.

Since the silicon oxide film 35A is formed thick on the bottoms of the trenches 14 and the sidewalls near the bottoms, the gate capacitance (of the gate electrode 38, the silicon oxide film 35A and the N− type semiconductor layer 12) is reduced.

Furthermore, since the corner portions 12A and 12B of the N− type semiconductor layer 12 are formed to be round, on the bottoms of the trenches 14 and the sidewalls near the bottoms, the N− type semiconductor layer 12 does not easily have crystal defects, and the thickness of the silicon oxide film 35A becomes constant and the gate electric field is dispersed so that the reduction of the gate breakdown voltage is prevented.

On the other hand, since the thin silicon oxide film 35B is formed as the gate insulation film on the active region (the region formed with the body layer 19) of the transistor on the upper portions of the sidewalls of the trenches 14, good transistor characteristics (low threshold, low on-resistance) are obtained.

Furthermore, since the silicon oxide film 35A functions as the thick gate insulation film on the upper ends of the sidewalls of the trenches 14 near the leading portions 38S of the gate electrodes 38, a long distance is provided between the leading portion 38S of the gate electrode 38 and the corner portion 12C of the N− type semiconductor layer 12. Furthermore, the silicon oxide film 35A in this portion is formed to be round reflecting the corner portions 12C of the N− type semiconductor layer 12. Therefore, the gate leakage current between the gate electrode 38 and the corner portion 12C of the N− type semiconductor layer 12 is reduced.

As a modification of the embodiment, a drain leading portion 26 and a drain electrode 27 may be formed as shown in FIG. 15 of the first embodiment. In this case, before the interlayer insulation film 24 is formed, an opening 12H is formed in the N− type semiconductor layer 12, an insulation film 28 is formed in the opening 12H, and the drain leading portion 26 is embedded therein. Then, the interlayer insulation film 24 is formed, a penetration hole H3 is formed penetrating the interlayer insulation film 24, and the drain electrode 27 is formed in the penetration hole H3, being connected to the drain leading portion 26.

Furthermore, as other modification of the embodiment, the gate electrodes 38 may be formed separately and isolatedly for the trenches 14 respectively in the similar manner to the first embodiment shown in FIG. 16. In this case, too, the same effect as that of the first embodiment is obtained.

The invention is not limited to the above embodiments and modifications are possible within the scope of the invention. For example, although the description is given for an N-channel type transistor in the embodiments described above, the invention is also applicable to a P-channel type transistor by changing the conductive types of the source layer 21, the body layer 19 and so on to the opposite conductive types.

Furthermore, the invention is also applicable to a device having an embedded gate electrode such as a trench gate type IGBT.

What is claimed is:

1. A trench gate type transistor comprising:
   a semiconductor layer having a trench formed therein, in plan view of the semiconductor layer, the trench being elongated in a first direction so as to have a first sidewall elongated in the first direction and a second sidewall disposed at an end of the first sidewall and extending in a second direction different from the first direction;
   a gate insulation film disposed in the trench and extending outside the trench so as to overlie a top surface of the semiconductor layer;
   a gate electrode disposed on the gate insulation film; and
   a body layer formed in the semiconductor layer so as to be in contact with the gate insulation film on the first sidewall of the trench,
   wherein, on the first sidewall of the trench where the body layer is in contact with the gate insulation film, the gate insulation film comprises a first portion having a first thickness on an upper portion of the sidewall of the trench and a second portion having a second thickness on a lower portion of the sidewall of the trench, the second thickness being larger than the first thickness, both the first portion and the second portion of the gate insulation film are in contact with the body layer, and the gate insulation film further comprises a third portion having the second thickness at a bottom of the trench, and
   wherein, on the second sidewall of the trench, the gate insulation film is made only of the second portion and does not include the first portion that is thinner than the second portion.

2. The trench gate type transistor of claim 1, wherein the gate insulation film is round at a top edge portion of the trench where the sidewall of the trench and the top surface of the semiconductor layer meet so as not to have an apex portion in a cross section thereof.

3. The trench gate type transistor of claim 1, further comprising a high breakdown voltage MOS transistor formed on the semiconductor layer comprising another gate insulation film made of the gate insulation film.

* * * * *